United States Patent
Wang et al.

(10) Patent No.: US 12,462,869 B2
(45) Date of Patent: Nov. 4, 2025

(54) MEMORY STRUCTURE, MANUFACTURING METHOD THEREOF, OPERATING METHOD THEREOF, AND MEMORY ARRAY

(71) Applicant: MACRONIX INTERNATIONAL CO., LTD., Hsinchu (TW)

(72) Inventors: Wei-Fu Wang, Keelung (TW); Yu-Yu Lin, New Taipei (TW); Feng-Min Lee, Hsinchu (TW); Wei-Lun Weng, Tainan (TW); Ming-Hsiu Lee, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 119 days.

(21) Appl. No.: 18/619,416

(22) Filed: Mar. 28, 2024

(65) Prior Publication Data
US 2025/0308577 A1    Oct. 2, 2025

(51) Int. Cl.
| | | |
|---|---|---|
| *G11C 11/4096* | (2006.01) | |
| *H10B 12/00* | (2023.01) | |
| *H10D 8/70* | (2025.01) | |

(52) U.S. Cl.
CPC ........ *G11C 11/4096* (2013.01); *H10B 12/038* (2023.02); *H10B 12/482* (2023.02); *H10D 8/70* (2025.01)

(58) Field of Classification Search
CPC .......... G11C 11/4096; H10B 12/038; H10B 12/482; H10D 8/70
(Continued)

(56) References Cited

U.S. PATENT DOCUMENTS

| | | | |
|---|---|---|---|
| 2009/0230458 A1* | 9/2009 | Ishiduki | H10D 30/693 257/E21.21 |
| 2010/0059895 A1* | 3/2010 | Wakisaka | H01L 21/78 257/E23.145 |

(Continued)

FOREIGN PATENT DOCUMENTS

| | | |
|---|---|---|
| TW | 202119603 A | 5/2021 |
| TW | 202123344 A | 6/2021 |

(Continued)

OTHER PUBLICATIONS

Han Li et al., "A Semi-Floating Gate Memory Based on SOI Substrate by TCAD Simulation" Electronics. 2019; 8(10): 1198.

*Primary Examiner* — Michael T Tran
(74) *Attorney, Agent, or Firm* — McClure, Qualey & Rodack, LLP

(57) ABSTRACT

A memory structure includes insulating layers, gate layers, a first doping layer, second doping layers, third doping layers, a columnar channel, a first dielectric layer, second dielectric layers, and a third dielectric layer. The first doping layer and the columnar channel penetrate through the insulating layers and the gate layers that are alternately stacked. The second doping layers are in direct contact with the first doping layer to form tunnel diodes, in which the second doping layers and the insulating layers are alternately stacked. The third doping layers surround the columnar channel and are connected to the second doping layers. The first dielectric layer is between the first doping layer and the gate layers. The second dielectric layers are between the third doping layers and the gate layers. The third dielectric layer is between the columnar channel and the third doping layers.

20 Claims, 24 Drawing Sheets

(58) Field of Classification Search
USPC .................................... 365/189.011, 189.05
See application file for complete search history.

(56) References Cited

U.S. PATENT DOCUMENTS

| | | | |
|---|---|---|---|
| 2010/0219392 A1* | 9/2010 | Awaya | H10B 63/22 257/3 |
| 2013/0062587 A1* | 3/2013 | Lee | H10N 70/046 257/E47.001 |
| 2013/0228739 A1* | 9/2013 | Sasago | H10B 63/20 257/4 |
| 2014/0269002 A1 | 9/2014 | Jo | |
| 2016/0308535 A1 | 10/2016 | Madurawe | |
| 2018/0138365 A1* | 5/2018 | Shur | H10H 20/8162 |
| 2018/0159537 A1 | 6/2018 | Madurawe | |
| 2020/0411600 A1* | 12/2020 | Yang | G06F 3/0414 |
| 2022/0238171 A1 | 7/2022 | Chung | |

FOREIGN PATENT DOCUMENTS

| | | | |
|---|---|---|---|
| TW | 202220177 A | 5/2022 | |
| TW | 202226548 A | 7/2022 | |
| TW | 202318643 A | 5/2023 | |
| TW | 202333346 A | 8/2023 | |

\* cited by examiner

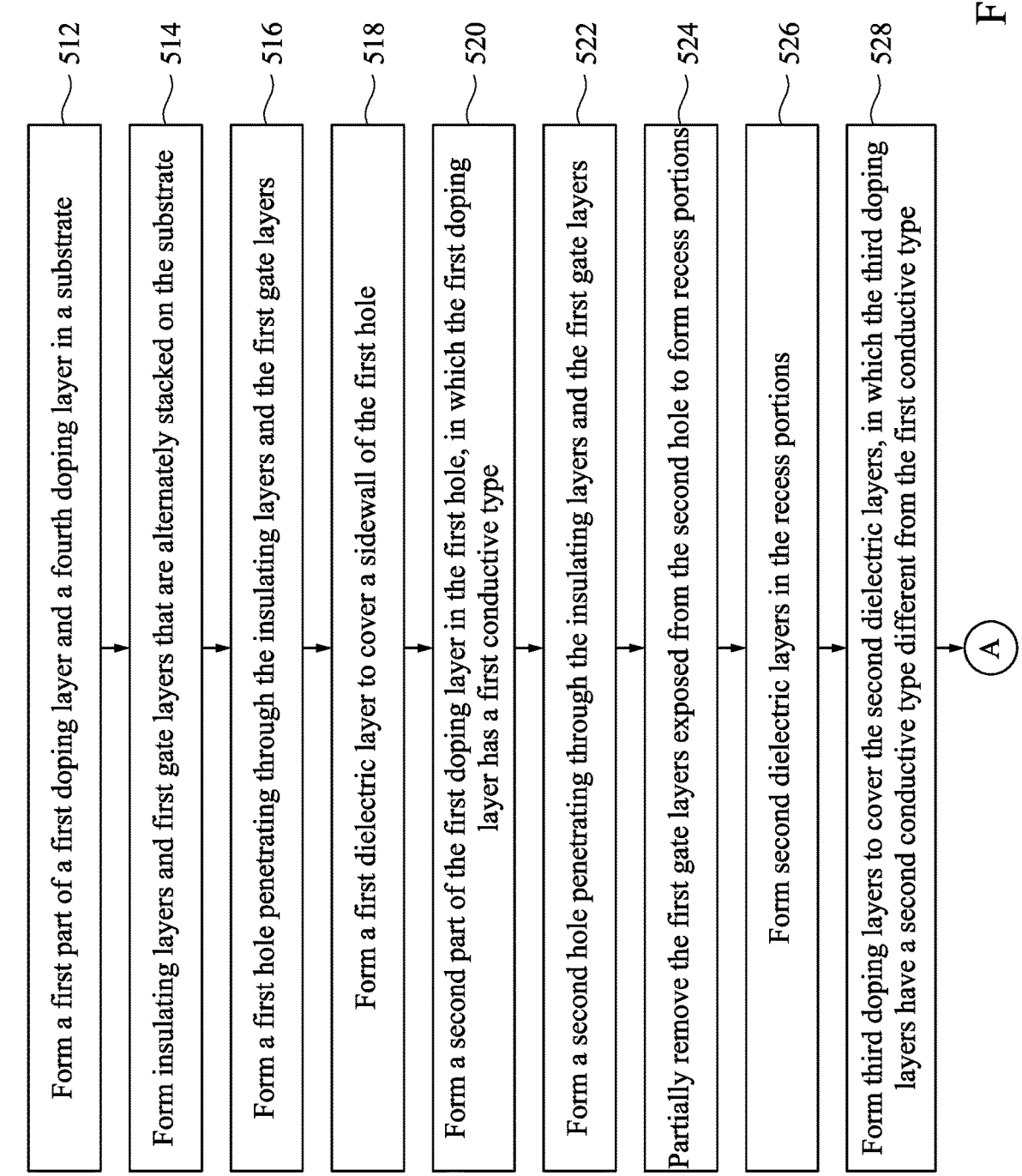

MEMORY STRUCTURE, MANUFACTURING METHOD THEREOF, OPERATING METHOD THEREOF, AND MEMORY ARRAY

BACKGROUND

Field of Invention

The present disclosure relates to a memory structure, a manufacturing method of the memory structure, an operating method of the memory structure, and a memory array.

Description of Related Art

Dynamic random access memories (DRAMs) are widely used because of their advantages of high density, low cost, and low power dissipation. However, as memory technology is approaching its physical limits, conventional DRAMs (e.g., DRAMs with one transistor and one capacitor (1T1C)) are facing a number of serious challenges in their development. For example, the DRAM size is not easily miniaturized, DRAM processes are becoming more complex, and the capacitor aspect ratio increases dramatically with size reduction. In view of the above, there is a need to provide a new dynamic random access memory and its manufacturing method to overcome the above problems.

SUMMARY

The present disclosure provides a memory structure that includes a plurality of insulating layers, a plurality of gate layers, a first doping layer, a plurality of second doping layers, a columnar channel, a plurality of third doping layers, a fourth doping layer, a fifth doping layer, a first dielectric layer, a plurality of second dielectric layers, a third dielectric layer, and a plurality of fourth dielectric layers. The insulating layers and the gate layers are alternately stacked. The first doping layer penetrates through the insulating layers and the gate layers and has a first conductive type. The second doping layers are respectively in direct contact with the first doping layer and have a second conductive type different from the first conductive type, in which the first doping layer and the second doping layers form a plurality of tunnel diodes, and the second doping layers and the insulating layers are alternately stacked. The columnar channel penetrates through the insulating layers and the gate layers. The third doping layers respectively surround the columnar channel, in which the third doping layers are respectively connected to the second doping layers, and the third doping layers have the second conductive type. The fourth doping layer and a fifth doping layer are coupled to the columnar channel. The first dielectric layer is disposed between the first doping layer and the gate layers. The second dielectric layers are respectively disposed between the third doping layers and the gate layers. The third dielectric layer is disposed between the columnar channel and the third doping layers. The fourth dielectric layers are respectively disposed between the second doping layers and the gate layers.

In some embodiments, the first conductive type is N-type, and the second conductive type is P-type.

In some embodiments, the first conductive type is P-type, and the second conductive type is N-type.

In some embodiments, the memory structure further includes a write bit-line disposed on the first doping layer.

In some embodiments, the memory structure further includes a read bit-line coupled to the fifth doping layer.

In some embodiments, the fourth doping layer is disposed under the columnar channel, the fifth doping layer is disposed on the columnar channel, and the fourth doping layer and the fifth doping layer have the second conductive type.

In some embodiments, the memory structure further includes a read bit-line disposed on the fifth doping layer.

In some embodiments, the columnar channel has the first conductive type.

In some embodiments, the columnar channel is undoped.

In some embodiments, doping concentrations of the third doping layers are higher than doping concentrations of the second doping layers.

The present disclosure provides a memory array that includes a plurality of memory structures of any one of above-mentioned embodiments, a plurality of write bit-lines, and a plurality of read bit-lines. The write bit-lines extend along a first direction, in which the first doping layers of the memory structures arranged along the first direction are coupled to each other through the write bit-lines. The read bit-lines extend along a second direction, in which the first direction is perpendicular to the second direction, and the fifth doping layers of the memory structures arranged along the second direction are coupled to each other through the read bit-lines.

The present disclosure provides a manufacturing method of a memory structure, and it includes the following operations. A first hole is formed to penetrate through a plurality of insulating layers and a plurality of first gate layers that are alternately stacked. A first dielectric layer is formed to cover a sidewall of the first hole. A first doping layer is formed in the first hole, in which the first doping layer has a first conductive type. A second hole is formed to penetrate through the insulating layers and the first gate layers. The first gate layers exposed from the second hole are partially removed to form a plurality of recess portions. A plurality of second dielectric layers is formed in the recess portions. A plurality of second doping layers is formed to cover the second dielectric layers, in which the second doping layers have a second conductive type that is different from the first conductive type. A third dielectric layer is formed in the second hole to cover the insulating layers and the second doping layers. A columnar channel is formed in the second hole. The first dielectric layer, the first gate layers, and the second dielectric layers between the first doping layer and the second doping layers are removed to form a plurality of trenches. A plurality of third doping layers is formed in the trenches to directly contact the first doping layer and connect to the second doping layers, in which the third doping layers have the second conductive type.

In some embodiments, the manufacturing method further includes the following operations: after forming the third doping layers in the trenches, forming a plurality of fourth dielectric layers adjacent to the third doping layers; and forming a plurality of second gate layers adjacent to the fourth dielectric layers.

In some embodiments, the manufacturing method further includes the following operations: before forming the second hole penetrating through the insulating layers and the first gate layers, forming a fourth doping layer in a substrate, and forming the insulating layers and the first gate layers on the substrate, in which the second hole exposes the fourth doping layer; and doping a top portion of the columnar channel to form a fifth doping layer.

In some embodiments, the manufacturing method further includes the following operations: forming a write bit-line on the first doping layer; and forming a read bit-line on the fifth doping layer.

In some embodiments, the first conductive type is N-type, and the second conductive type is P-type.

In some embodiments, the first conductive type is P-type, and the second conductive type is N-type.

The present disclosure provides an operating method of a memory structure, and it includes the following operations. The memory structure of any one of above-mentioned embodiments is received, in which the gate layers, the third doping layers, the fourth doping layer, the fifth doping layer, and the columnar channel form a plurality of read transistors. When the read transistors are P-type transistors, and the first conductive type is N-type, a write operation is performed. The write operation includes applying a reverse bias to a first one of the tunnel diodes so that one of the third doping layers corresponding to the first one has high potential; or applying a forward bias to a second one of the tunnel diodes so that one of the third doping layers corresponding to the second one has low potential. When the read transistors are N-type transistors, and the first conductive type is P-type, a write operation is performed. The write operation includes applying a reverse bias to a third one of the tunnel diodes so that one of the third doping layers corresponding to the third one has low potential; or applying a forward bias to a fourth one of the tunnel diodes so that one of the third doping layers corresponding to the fourth one has high potential.

In some embodiments, the read transistors are the P-type transistors, and the operating method further includes the following operations. 0V is applied to a selected gate of the gate layers corresponding to the third doping layer having the high potential or the low potential. A plurality of negative voltages is applied to a plurality of unselected gates in the gate layers. A positive voltage is applied to the fourth doping layer or the fifth doping layer.

In some embodiments, the read transistors are the N-type transistors, and the operating method further includes the following operations. 0V is applied to a selected gate of the gate layers corresponding to the third doping layer having the high potential or the low potential. A plurality of positive voltages is applied to a plurality of unselected gates in the gate layers. A positive voltage is applied to the fourth doping layer or the fifth doping layer.

BRIEF DESCRIPTION OF THE DRAWINGS

The present disclosure can be more fully understood by reading the following detailed description of the embodiment, with reference made to the accompanying drawings as follows.

FIG. 5A and FIG. 5B are flowcharts of a manufacturing method of a memory structure according to various embodiments of the present disclosure.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

It will be understood that, although the terms, first, second, third etc. may be used herein to describe various elements, components, regions, layers, and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present disclosure.

Further, it should be understood that when an element A is referred to as being "connected to" or "coupled to" an element B, the element A can be directly connected to the element B or indirectly connected to the element B (e.g., an intervening element C (and/or other elements) may be positioned between the element A and the element B).

The present disclosure provides a memory structure that is a three dimensional (3D) dynamic random access memory (DRAM) structure. The memory structure includes a plurality of memory cells, and each memory cell includes a tunnel diode and a read transistor to form a 1D1T DRAM structure. The memory structure of the present disclosure has high-density memory cells, which is beneficial to shrinking the size of the memory structure. Moreover, the process of manufacturing the memory structure is simple, so the manufacturing cost can be reduced, thereby replacing a traditional 1T1C DRAM structure. Furthermore, a plurality of memory structures can form a memory array. The memory array has high-density memory cells, which is beneficial to shrinking the size of the memory array.

Figure 1A:
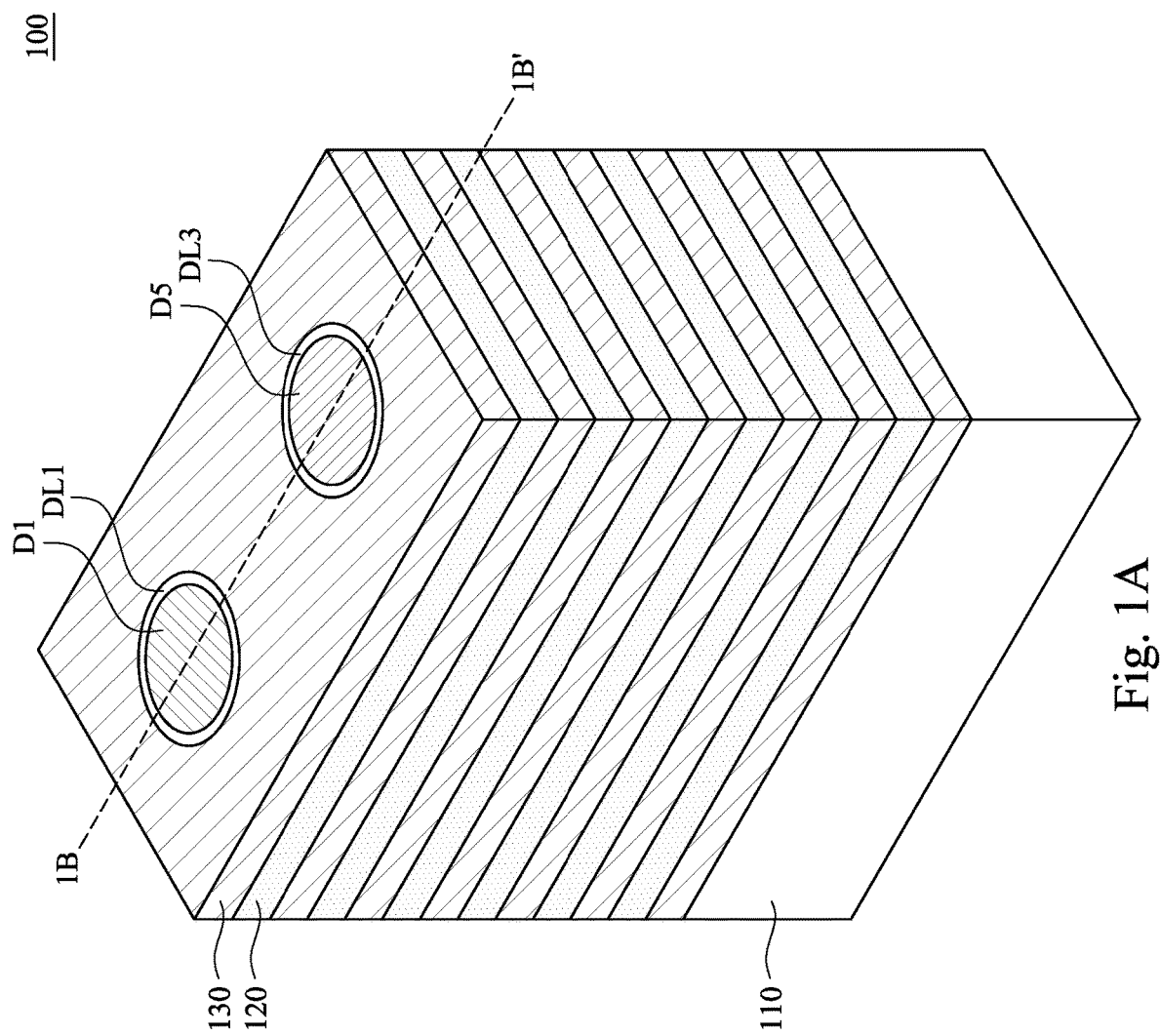
FIG. 1A is a three-dimensional schematic diagram of a memory structure according to various embodiments of the present disclosure.
Figure 1B:
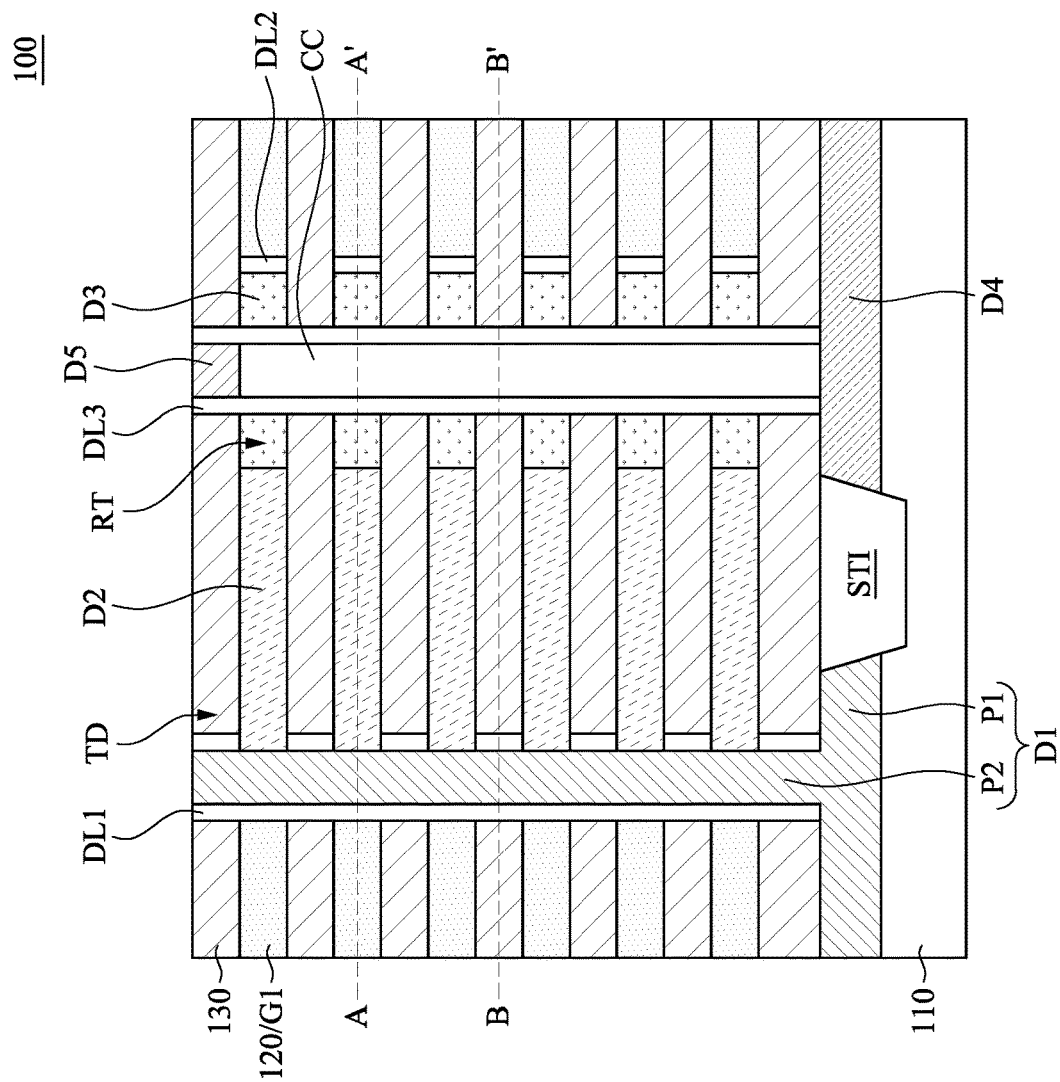
FIG. 1B is a schematic cross-sectional view along the section line 1B-1B' of FIG. 1A.
Figure 2:
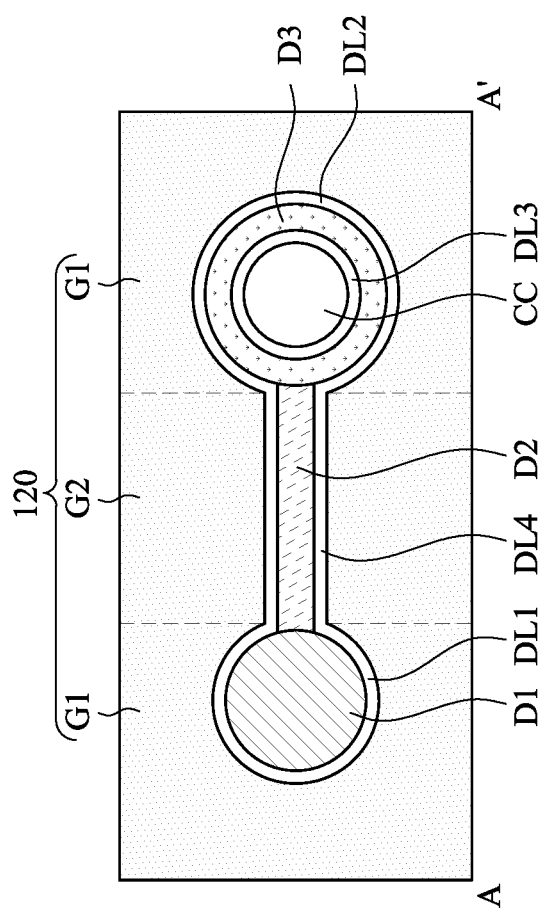
FIG. 2 is a schematic cross-sectional view along the section line A-A' of FIG. 1B.
Figure 3:
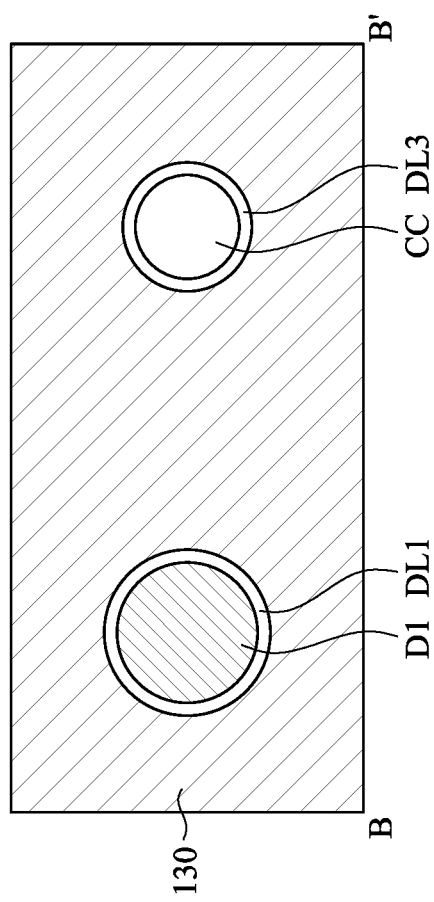
FIG. 3 is a schematic cross-sectional view along the section line B-B' of FIG. 1B.

FIG. 1A is a three-dimensional schematic diagram of a memory structure 100 according to various embodiments of the present disclosure. FIG. 1B is a schematic cross-sectional view along the section line 1B-1B' of FIG. 1A. FIG. 2 is a schematic cross-sectional view along the section line A-A' of FIG. 1B. FIG. 3 is a schematic cross-sectional view along the section line B-B' of FIG. 1B. As shown in FIG. 1A to FIG. 3, the memory structure 100 includes a substrate 110, an isolation structure STI, a plurality of gate layers 120, a plurality of insulating layers 130, a first doping layer D1, a plurality of second doping layers D2, a plurality of third doping layers D3, a fourth doping layer D4, a fifth doping layer D5, a columnar channel CC, a first dielectric layer DL1, a plurality of second dielectric layers DL2, a third dielectric layer DL3, and a plurality of fourth dielectric layers DL4.

In some embodiments, the substrate 110 is a semiconductor substrate. In some embodiments, the substrate 110 includes any suitable semiconductor materials and/or semiconductor materials used to form semiconductor structures. These semiconductor materials include, for example, one or more materials, such as crystalline silicon, silicon oxide, strained silicon, silicon germanium, doped or undoped polysilicon, doped or undoped silicon wafers, germanium, gallium arsenide, other suitable semiconductor materials, or combinations thereof. In some embodiments, the substrate 110 is a silicon substrate. In some embodiments, the gate layers 120 include metallic conductive materials, non-metallic conductive materials, or combinations thereof, such as tungsten nitride, tungsten, copper, aluminum, gold, silver, other suitable metals, metal alloys, polysilicon, or combinations thereof. In some embodiments, the insulating layers 130 include oxides, nitrides, or combinations thereof, such as silicon dioxide, silicon nitride, or combinations thereof. In some embodiments, the isolation structure STI is a shallow trench isolation (STI). In some embodiments, the memory structure 100 further includes a complementary metal-oxide-semiconductor (CMOS) device (not shown) disposed in the substrate 110 to be electrically connected to the first doping layer D1 or the fourth doping layer D4.

Please refer to FIG. 1A and FIG. 1B at the same time. The gate layers 120 and the insulating layers 130 are alternately stacked. The numbers of the gate layers 120 and the insulating layers 130 can be adjusted arbitrarily, and are not limited thereto. The first doping layer D1 penetrates through the gate layers 120 and the insulating layers 130 and has a first conductive type. As shown in FIG. 1B, the first doping layer D1 includes a first part P1 and a second part P2 connected to each other, in which the first part P1 penetrates through the gate layers 120 and the insulating layers 130, and the second part P2 is located in the substrate 110. Each of the second doping layers D2 directly contacts the first doping layer D1 and has a second conductive type different from the first conductive type. The first doping layer D1 and the second doping layers D2 form a plurality of tunnel diodes TD, in which the second doping layers D2 and insulating layers 130 are alternately stacked, and the tunnel diodes TD serve as access selectors. As shown in FIG. 1B, the tunnel diodes TD are connected to each other in the longitudinal direction, so the memory structure can have a high density of the tunnel diodes TD, which facilitates size reduction. In some embodiments, the first conductive type is N-type, and the second conductive type is P-type, so the first doping layer D1 is a cathode, and the second doping layers D2 are anodes. In other embodiments, the first conductive type is P-type, and the second conductive type is N-type, so the first doping layer D1 is an anode, and the second doping layers D2 are cathodes. The columnar channel CC penetrates through the gate layers 120 and the insulating layers 130. As shown in FIG. 1B and FIG. 2, the third doping layers D3 respectively surround the column channel CC and are respectively connected to the second doping layers D2, in which the third doping layers D3 have the second conductive type. In some embodiments, the third doping layers D3 directly contact the second doping layers D2. As shown in FIG. 2, each gate layer 120 includes first gate layers G1 and second gate layers G2. The first gate layers G1 surround the first doping layer D1, the third doping layer D3, and the column channel CC. The second gate layers G2 are located on both sides of the second doping layer D2.

Please continue to refer to FIG. 1B and FIG. 2, the fourth doping layer D4 and the fifth doping layer D5 are respectively coupled to the column channel CC. In some embodiments, as shown in FIG. 1B, the fourth doping layer D4 is disposed under the column channel CC, and the fifth doping layer D5 is disposed on the column channel CC, but the placement is not limited to this. The fourth doping layer D4 and the fifth doping layer D5 have the second conductive type. In some embodiments, the fourth doping layer D4 is a source, and the fifth doping layer D5 is a drain. In other embodiments, the fourth doping layer D4 is a drain, and the fifth doping layer D5 is a source. The gate layers 120, the third doping layers D3, the fourth doping layer D4, the fifth doping layer D5, and the column channel CC form a plurality of read transistors RT. The read transistors RT can be P-type transistors or N-type transistors. As shown in FIG. 1B, these read transistors RT are connected to each other in the longitudinal direction, so the memory structure 100 can have a high density of the read transistors RT, which facilitates size reduction. As shown in FIG. 2, the column channel CC of the read transistor RT is surrounded by the third doping layers D3 and the gate layers 120. The third doping layers D3 and the gate layers 120 serve as the gates of the read transistors RT. The third doping layers D3 are ring-shaped. A write operation may be performed by applying a reverse bias or a forward bias to one of the tunnel diodes TD so that the corresponding third doping layer D3 surrounding the column channel CC have high potential or low potential. Thus, data 1 or data 0 is written to the read transistor RT. The third doping layers D3 can store charges and are rechargeable or dischargeable. The potential of the third doping layers D3 can be controlled by charging or discharging the third doping layers D3. The third doping layers D3 can also be called storage nodes (SNs). The storage nodes can determine the threshold voltages of the read transistors RT. The operating method of the memory structure 100 will be further explained by circuit diagrams later.

As shown in FIG. 1B to FIG. 3, the first dielectric layer DL1 is disposed between the first doping layer D1 and the gate layers 120 and between the first doping layer D1 and the insulating layers 130, so the gate layers 120 and the first doping layer D1 are electrically isolated. The second dielectric layers DL2 are respectively disposed between the third doping layers D3 and the gate layers 120, so the gate layers 120 and the third doping layers D3 are electrically isolated. The third dielectric layer DL3 is disposed between the columnar channel CC and the third doping layers D3 and between the columnar channel CC and the insulating layers 130, so the columnar channel CC and the third doping layers D3 are electrically isolated. The third dielectric layer DL3 is ring-shaped. The fourth dielectric layers DL4 are respectively disposed between the second doping layers D2 and the gate layers 120, so the gate layers 120 and the second doping layers D2 are electrically isolated. Please refer to FIG. 1A and FIG. 1B again. In some embodiments, the third dielectric layer DL3 is disposed between the fifth doping layer D5 and one of the insulating layers 130. In some embodiments, the first dielectric layer DL1, the second dielectric layers DL2, the third dielectric layer DL3, and the fourth dielectric layers DL4 respectively include a gate oxide. In some embodiments, the second dielectric layers DL2, the third dielectric layer DL3, and the fourth dielectric layers DL4 respectively include silicon dioxide, silicon nitride, silicon oxynitride, aluminum oxide, hafnium oxide, zirconium oxide, titanium oxide, tantalum oxide, other suitable high-k dielectric materials, or combinations thereof.

Please refer to FIG. 1B and FIG. 2 again. The first doping layer D1 has the first conductive type, the second doping layers D2, the third doping layers D3, the fourth doping layer D4, and the fifth doping layer D5 have the second conductive type, in which the first conductive type and the second conductive type are different. In some embodiments, the materials of the first doping layer D1, the second doping layers D2, the third doping layers D3, the fourth doping layer D4, and the fifth doping layer D5 respectively include silicon, such as crystalline silicon, polycrystalline silicon, or germanium silicon, but are not limited thereto. In some embodiments, the first conductive type is N-type, and the second conductive type is P-type. The read transistors RT including the fourth doping layer D4 and the fifth doping layer D5 are P-type transistors, such as P-type metal-oxide-semiconductor field-effect transistors (PMOSFETs). In some embodiments, the doping concentrations of the third doping layers D3 are higher than the doping concentrations of the second doping layers D2. In some embodiments, the first doping layer D1 is an N+ doping region, the second doping layers D2 are P− doping regions, the third doping layers D3 are P+ doping regions, and the fourth doping layer D4 and fifth doping layer D5 are P+ doping regions. In some embodiments, the columnar channel CC has the first conductive type, and columnar channel CC is, for example, an N− doping region. In other embodiments, the column channel CC is undoped.

Please refer to FIG. 1B and FIG. 2 again. The first doping layer D1 has the first conductive type, the second doping layers D2, the third doping layers D3, the fourth doping layer D4, and the fifth doping layer D5 have the second conductive type, in which the first conductive type and the second conductive type are different. In some embodiments, the first conductive type is P-type, and the second conductive type is N-type. The read transistors RT including the fourth doping layer D4 and the fifth doping layer D5 are N-type transistors, such as N-type metal-oxide-semiconductor field-effect transistors (NMOSFETs). In some embodiments, the doping concentrations of the third doping layers D3 are higher than the doping concentrations of the second doping layers D2. In some embodiments, the first doping layer D1 is a P+ doping region, the second doping layers D2 are N− doping regions, the third doping layers D3 are N+ doping region, and the fourth doping layer D4 and the fifth doping layer D5 are N+ doping regions. In some embodiments, the columnar channel CC has the first conductive type, and the columnar channel CC is, for example, a P− doping region. In other embodiments, the column channel CC is undoped.

In some embodiments, the material of the columnar channel CC include silicon, germanium, polysilicon, semiconductor oxides (such as indium oxide ($In_2O_3$), indium gallium zinc oxide (IGZO), indium tin oxide (ITO)), or other suitable III-V materials.

Figure 4:
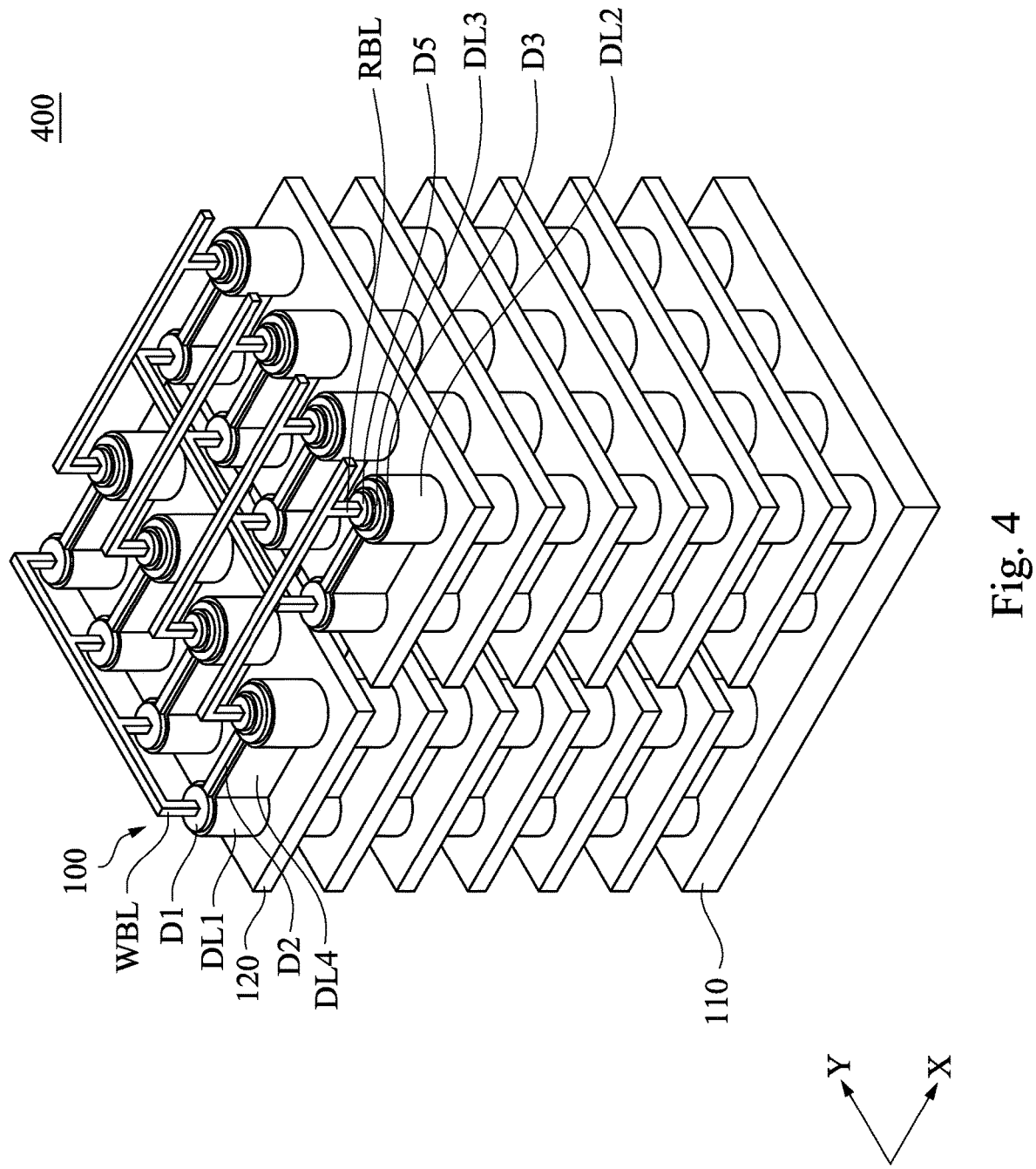
FIG. 4 is a three-dimensional schematic diagram of a memory array according to various embodiments of the present disclosure.

Please refer to FIG. 1A again. A plurality of the memory structures 100 can form a memory array. The present disclosure provides a memory array including a plurality of memory structures 100, a plurality of write bit-lines, and a plurality of read bit-lines. The write bit-lines extend along a first direction, and the first doping layers D1 of the memory structures 100 arranged along the first direction are coupled to each other through these write bit-lines. The read bit-lines extend along a second direction, in which the first direction is perpendicular to the second direction. The fifth doping layers D5 of the memory structures 100 arranged along the second direction are coupled to each other through these read bit-lines. FIG. 4 is a three-dimensional schematic diagram of a memory array 400 according to various embodiments of the present disclosure. The memory array 400 includes eight memory structures 100 as shown in FIG. 1A, but the present disclosure is not limited thereto. The number of the memory structures 100 can be adjusted arbitrarily according to design requirements to, for example, 2, 4, 6, 8, 10, 12, 14, 16, 18, or 20. The memory array 400 includes a plurality of memory structures 100 in the first direction Y and a plurality of write bit-lines WBL extending along the first direction Y. The memory array 400 includes a plurality of memory structures 100 in the second direction X and a plurality of read bit-line RBL extending along the second direction X. The first direction Y is perpendicular to the second direction X. In the memory array 400, a plurality of gate layers 120 and a plurality of insulating layers are alternately stacked. In the second direction X, the gate layers 120 of the adjacent memory structures 100 are separated by insulating layers. However, for the sake of clarity, the insulating layers are not shown. In addition, for the sake of clarity, the positions of the components in the columnar structure are moved upward to clearly show the relative positions between the first doping layer D1, the second doping layer D2, the third doping layer D3, the fifth doping layer D5, the first dielectric layer DL1, the second dielectric layer DL2, the third dielectric layer DL3, and the fourth dielectric layer DL4. The memory structures 100 are coupled to each other through the read bit-lines RBL and the write bit-lines WBL to form the memory array 400. As shown in FIG. 4, the first doping layers D1 of the memory structures 100 arranged along the first direction Y are coupled to each other through these write bit-lines WBL, and the fifth doping layers D5 of the memory structures 100 arranged along the second direction X are coupled to each other through these read bit-lines RBL. In the memory array 400, data can be written to the memory structures 100 through the write bit-lines WBL, and data in the memory structures 100 can be read through the read bit-lines RBL. Therefore, the memory array 400 can significantly increase the writing speed and reading speed.

Figure 5B:
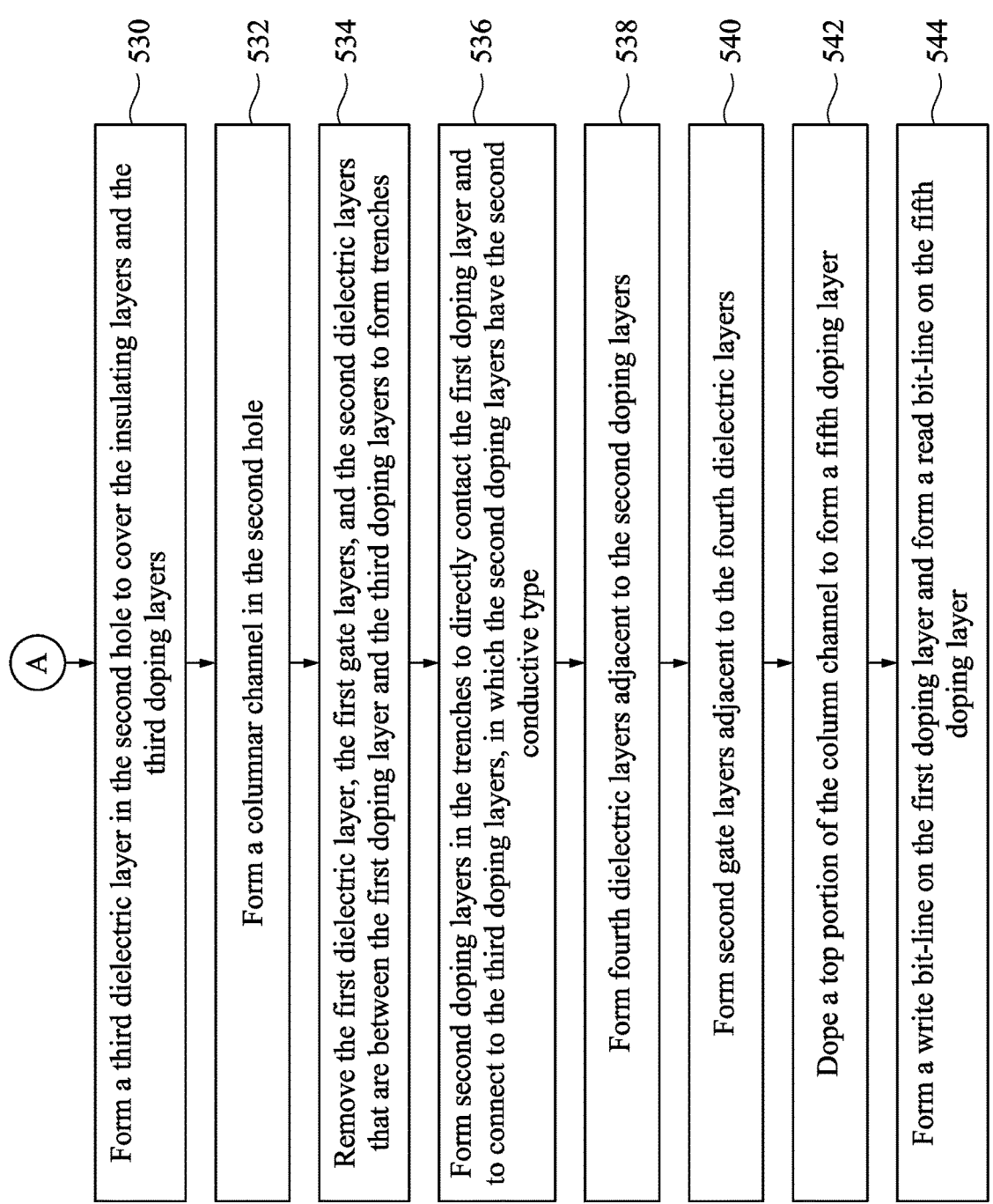

The present disclosure provides a manufacturing method of a memory structure. Please refer to FIG. 2 and FIG. 5A to FIG. 6I. FIG. 5A and FIG. 5B are flowcharts of a manufacturing method 500 of a memory structure according to various embodiments of the present disclosure. The manufacturing method 500 includes operation 512, operation 514, operation 516, operation 518, operation 520, operation 522, operation 524, operation 526, operation 528, operation 530, operation 532, operation 534, operation 536, operation 538, operation 540, operation 542, and operation 544. FIG. 6A to FIG. 6I are schematic cross-sectional views of intermediate stages of manufacturing a memory structure according to various embodiments of the present disclosure. The above-mentioned operations 512 to 544 will be described later with FIG. 6A to FIG. 6I and FIG. 2. The manufacturing method of the present disclosure has a simple process, so the manufacturing cost can be reduced.

Although a series of operations or steps are used below to describe the method disclosed herein, an order of these operations or steps should not be construed as a limitation to the present disclosure. For example, some operations or steps may be performed in a different order, and/or other steps may be performed at the same time. In addition, it is not necessary to perform all of the operations, steps, and/or features shown to achieve the embodiments of the present disclosure. In addition, each operation or step described herein may contain several sub-steps or actions.

Figure 6A:
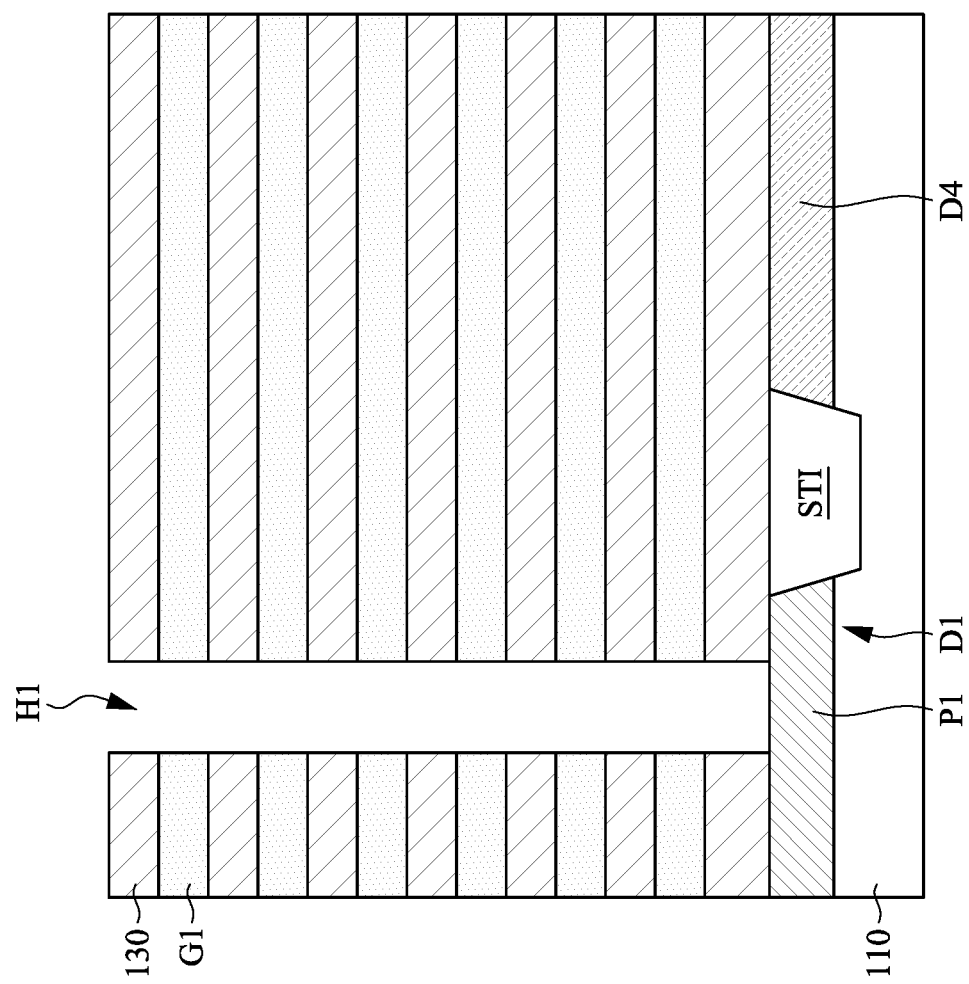
FIG. 6A to FIG. 6I are schematic cross-sectional views of intermediate stages of manufacturing a memory structure according to various embodiments of the present disclosure.

In operation 512, as shown in FIG. 6A, the first part P1 and the fourth doping layer D4 of the first doping layer D1 are formed in the substrate 110. The first part P1 of the first doping layer D1 and the fourth doping layer D4 are electrically isolated by the isolation structure STI embedded in the substrate 110. In some embodiments, the first part P1 and the fourth doping layer D4 of the first doping layer D1 are respectively formed by doping a portion of the substrate 110. In operation 514, as shown in FIG. 6A, a plurality of insulating layers 130 and a plurality of first gate layers G1 that are alternately stacked are formed on the substrate 110. In operation 516, as shown in FIG. 6A, a first hole H1 is formed to penetrate through the insulating layers 130 and the first gate layers G1 to expose the first part P1 of the first doping layer D1. In some embodiments, the first hole H1 is formed by an etching process.

Figure 6B:
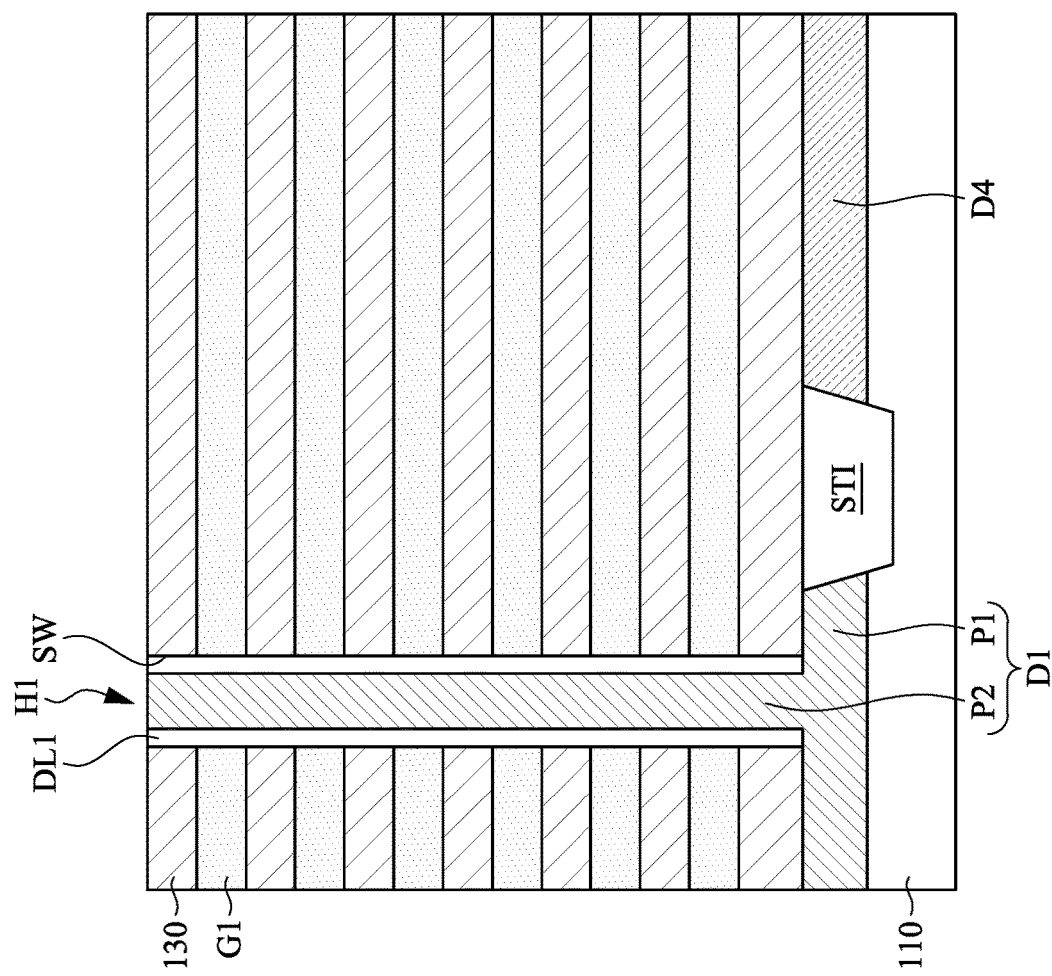

In operation 518, as shown in FIG. 6B, the first dielectric layer DL1 is formed to cover the sidewall SW of the first hole H1. In operation 520, as shown in FIG. 6B, the second part P2 of the first doping layer D1 is formed in the first hole H1, in which the first doping layer D1 has the first conductive type. In some embodiments, the second part P2 of the first doping layer D1 is formed by a deposition process. In some embodiments, the first doping layer D1 has the first conductive type, the fourth doping layer D4 has the second conductive type, and the first conductive type is different from the second conductive type. In some embodiments, the first conductive type is N-type, and the second conductive type is P-type. In other embodiments, the first conductive type is P-type, and the second conductive type is N-type.

Figure 6C:
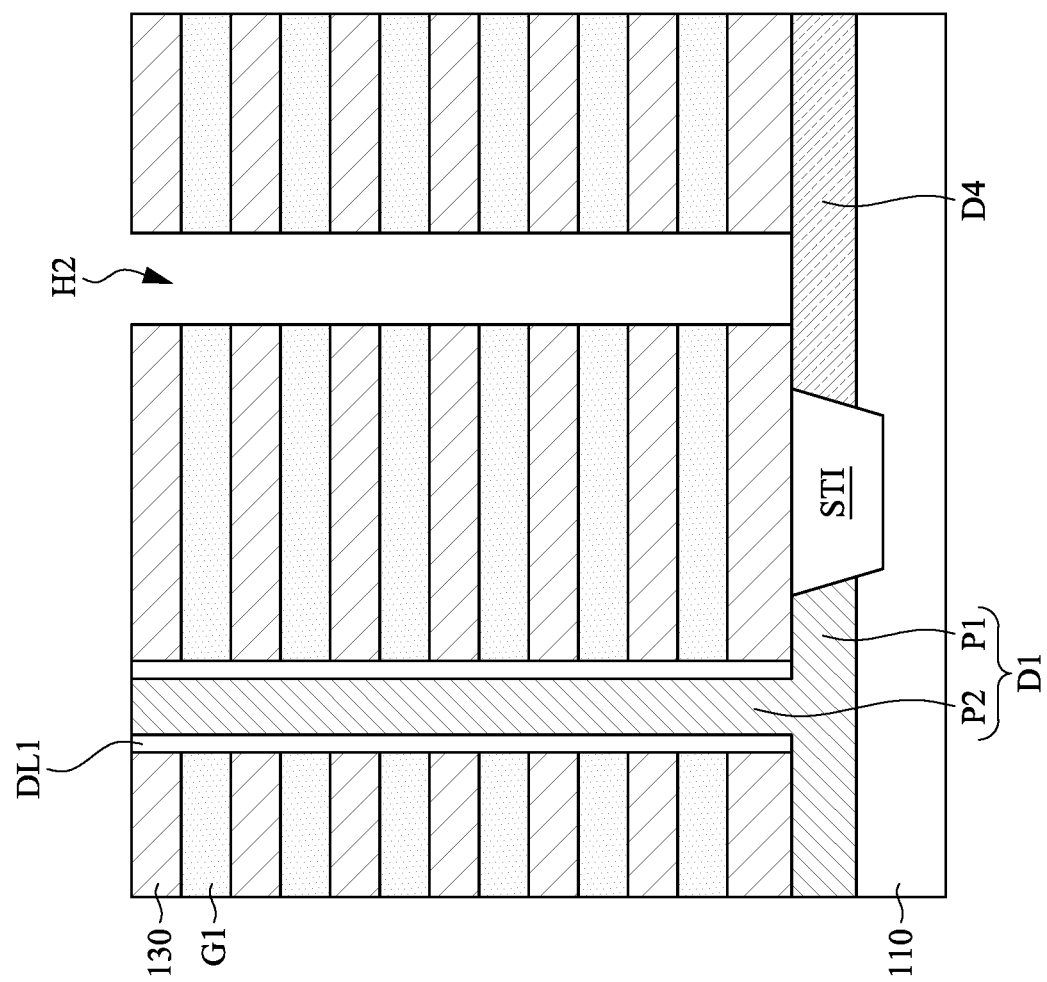
Figure 6D:
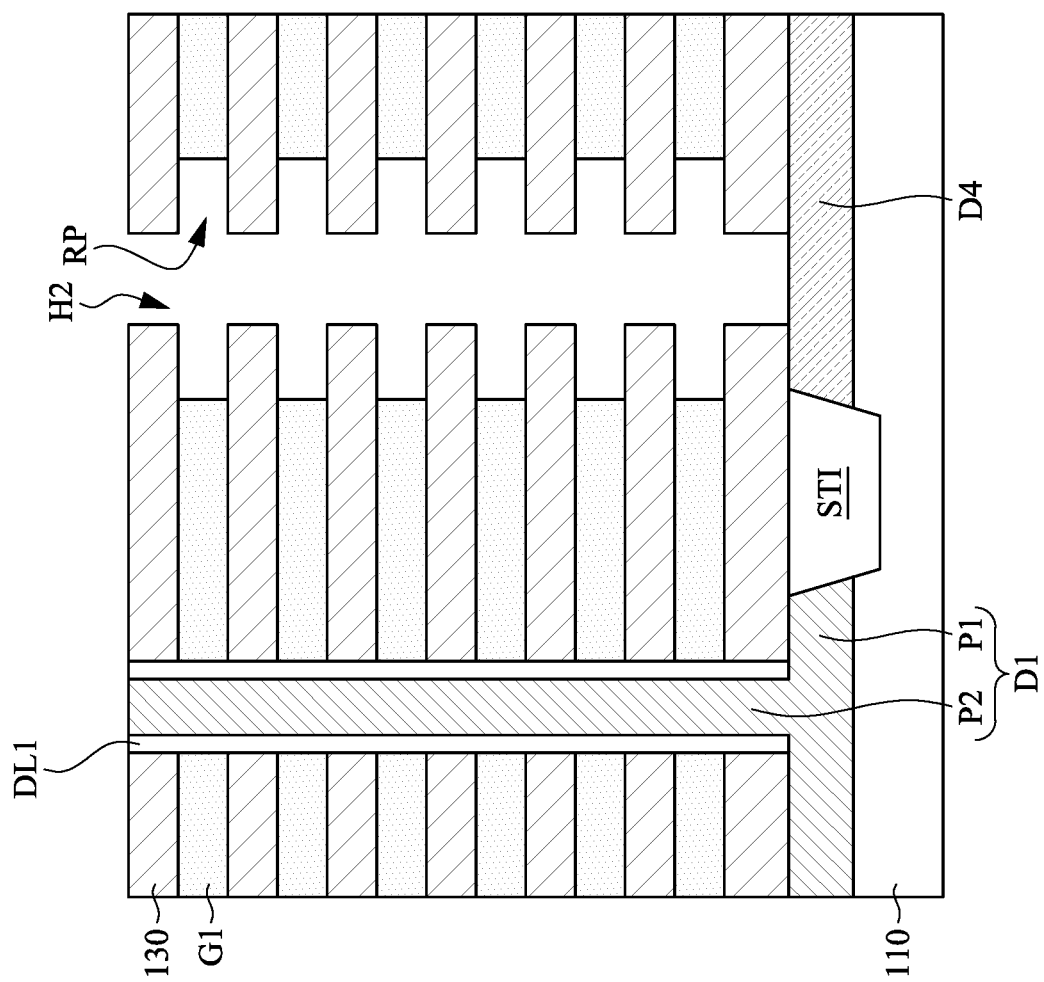

In operation 522, as shown in FIG. 6C, a second hole H2 is formed to penetrate through the insulating layers 130 and the first gate layers G1. The second hole H2 exposes the fourth doping layer D4. In some embodiments, the second hole H2 is formed by an etching process. In operation 524, as shown in FIG. 6D, the first gate layers G1 exposed from the second hole H2 are partially removed to form a plurality of recess portions RP. After operation 524, the sidewall of the second hole H2 has the recess portions RP. In some embodiments, the partially removing the first gate layers G1 is performed by a wet etching process.

Figure 6E:
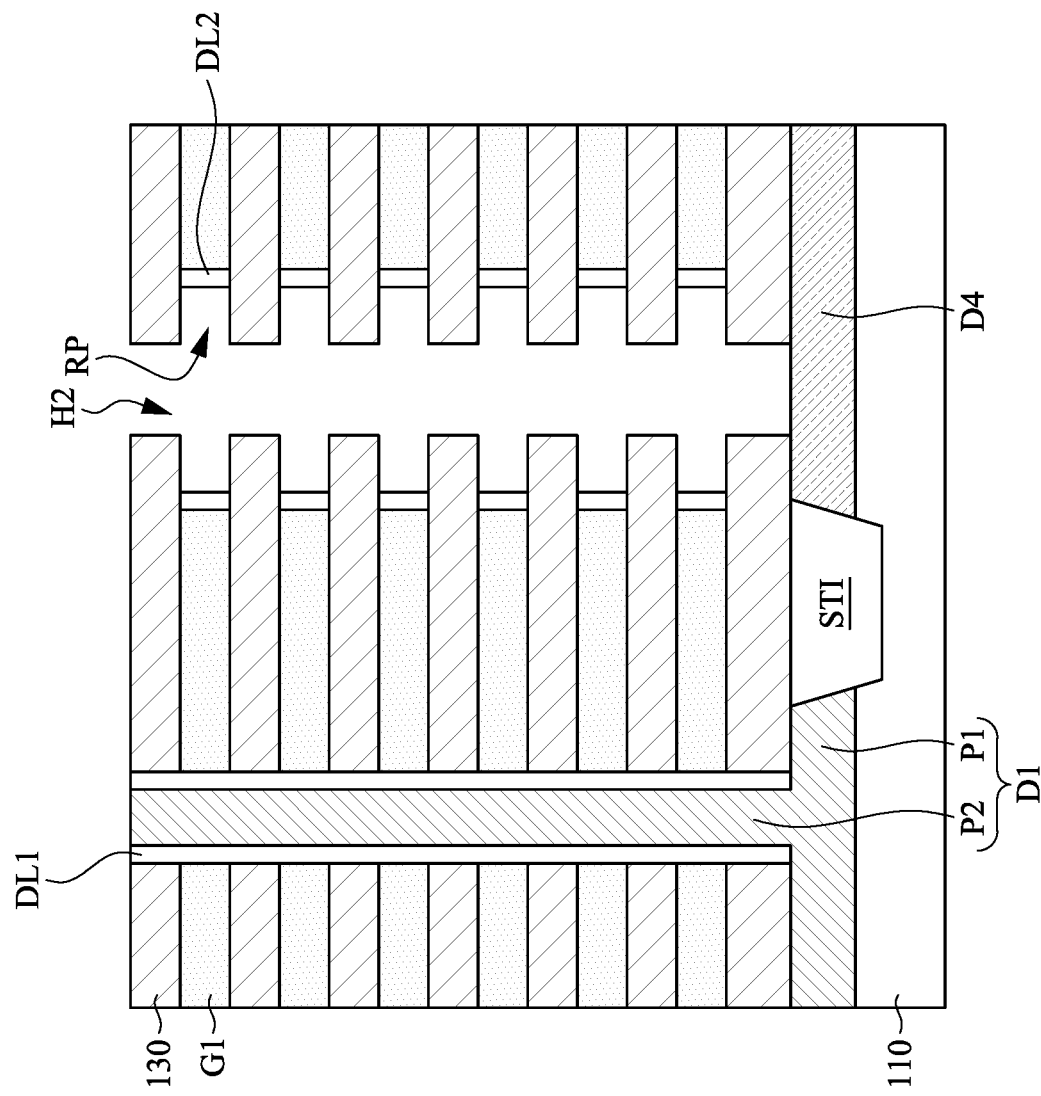
Figure 6F:
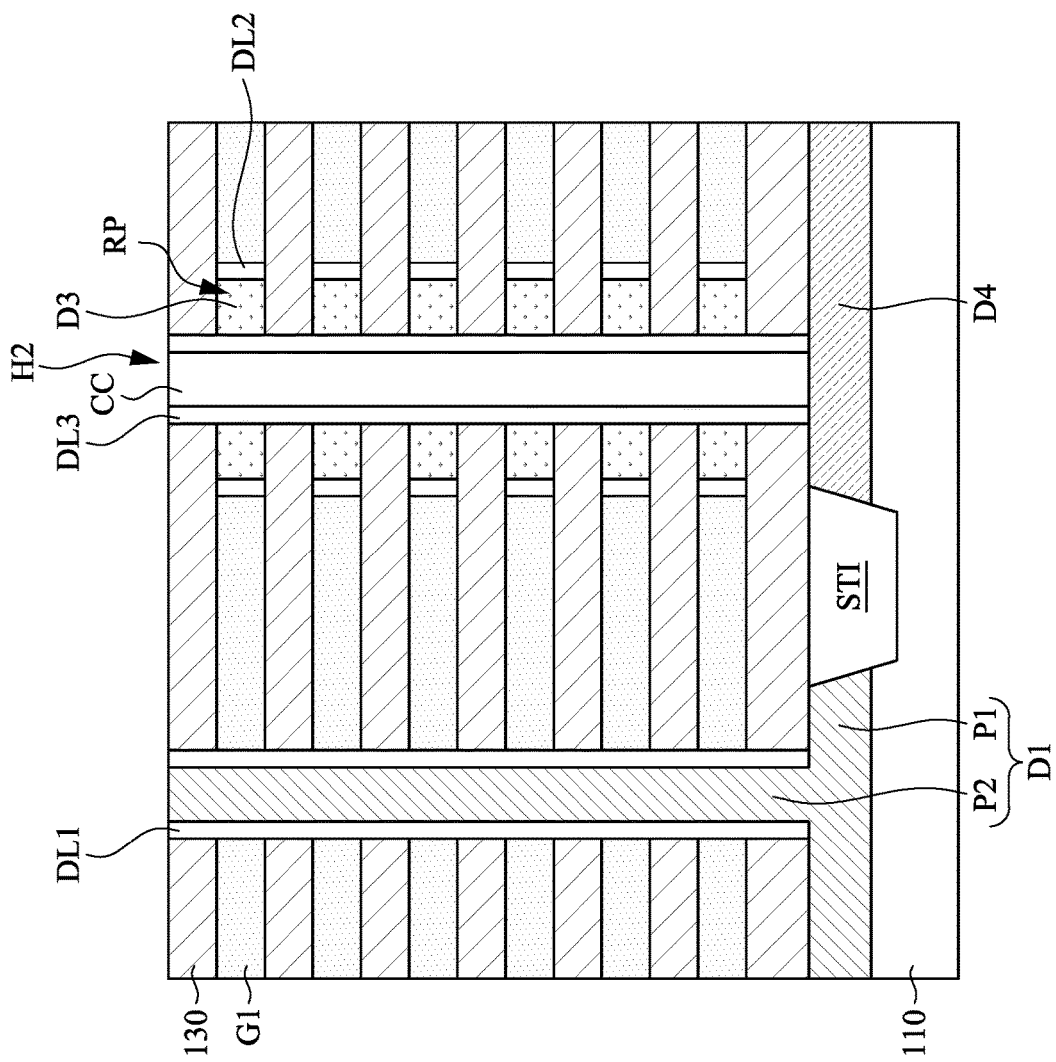

In operation 526, as shown in FIG. 6E, a plurality of second dielectric layers DL2 is formed in the recess portions RP to cover the first gate layers G1 that are partially removed. Specifically, the second dielectric layers DL2 are respectively formed in the recess portions RP and do not fill the recess portions RP. In operation 528, as shown in FIG. 6F, a plurality of third doping layers D3 are formed to cover the second dielectric layers DL2, in which the third doping layers D3 have a second conductive type different from the first conductive type. Specifically, the third doping layers D3 are respectively formed in the recess portions RP and fill the recess portions RP. In operation 530, as shown in FIG. 6F, a third dielectric layer DL3 is formed in the second hole H2 to cover the insulating layers 130 and the third doping layers D3. The third dielectric layer DL3 does not fill the second hole H2. In operation 532, as shown in FIG. 6F, the column channel CC is formed in second hole H2. The columnar channel CC fills the second hole H2.

Figure 6G:
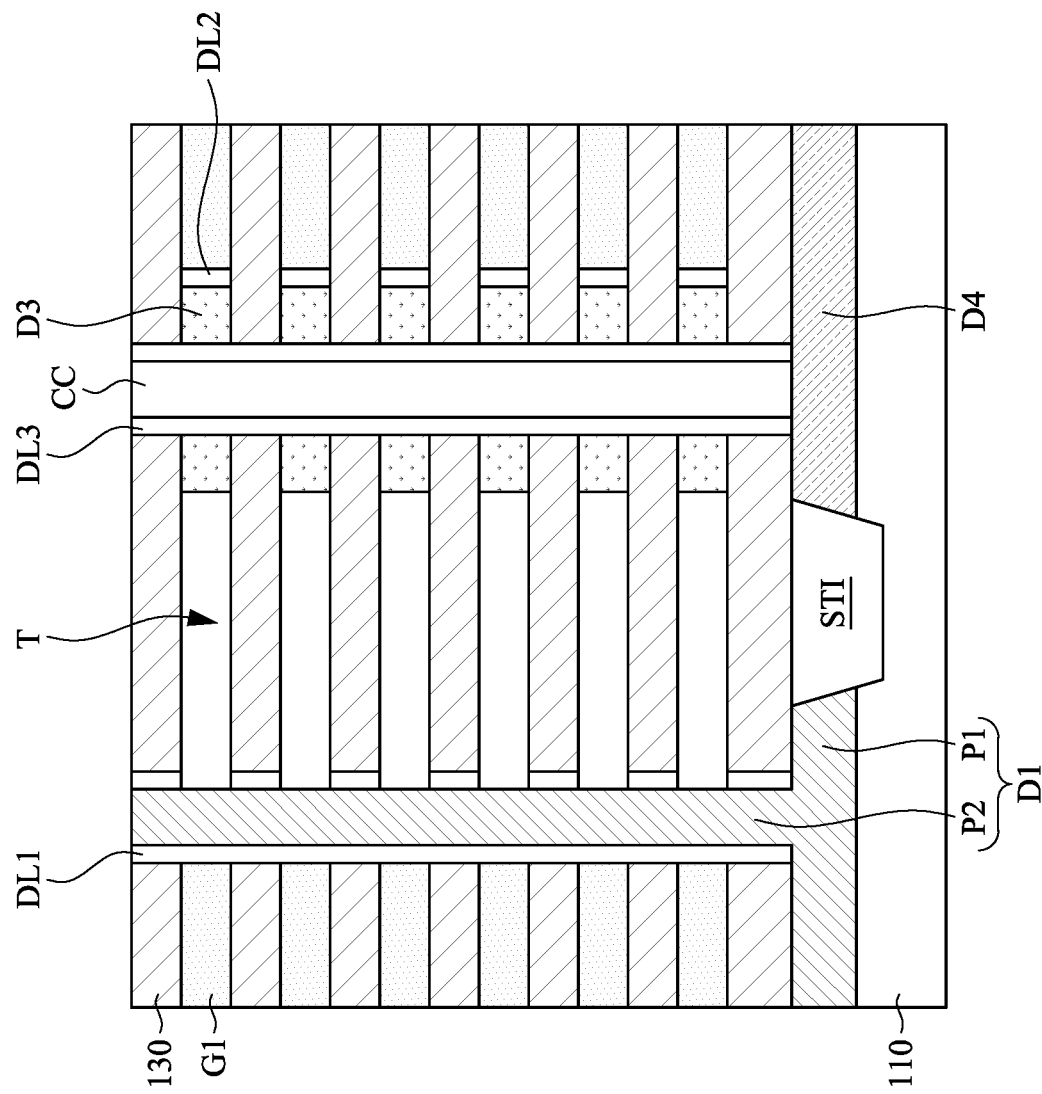
Figure 6H:
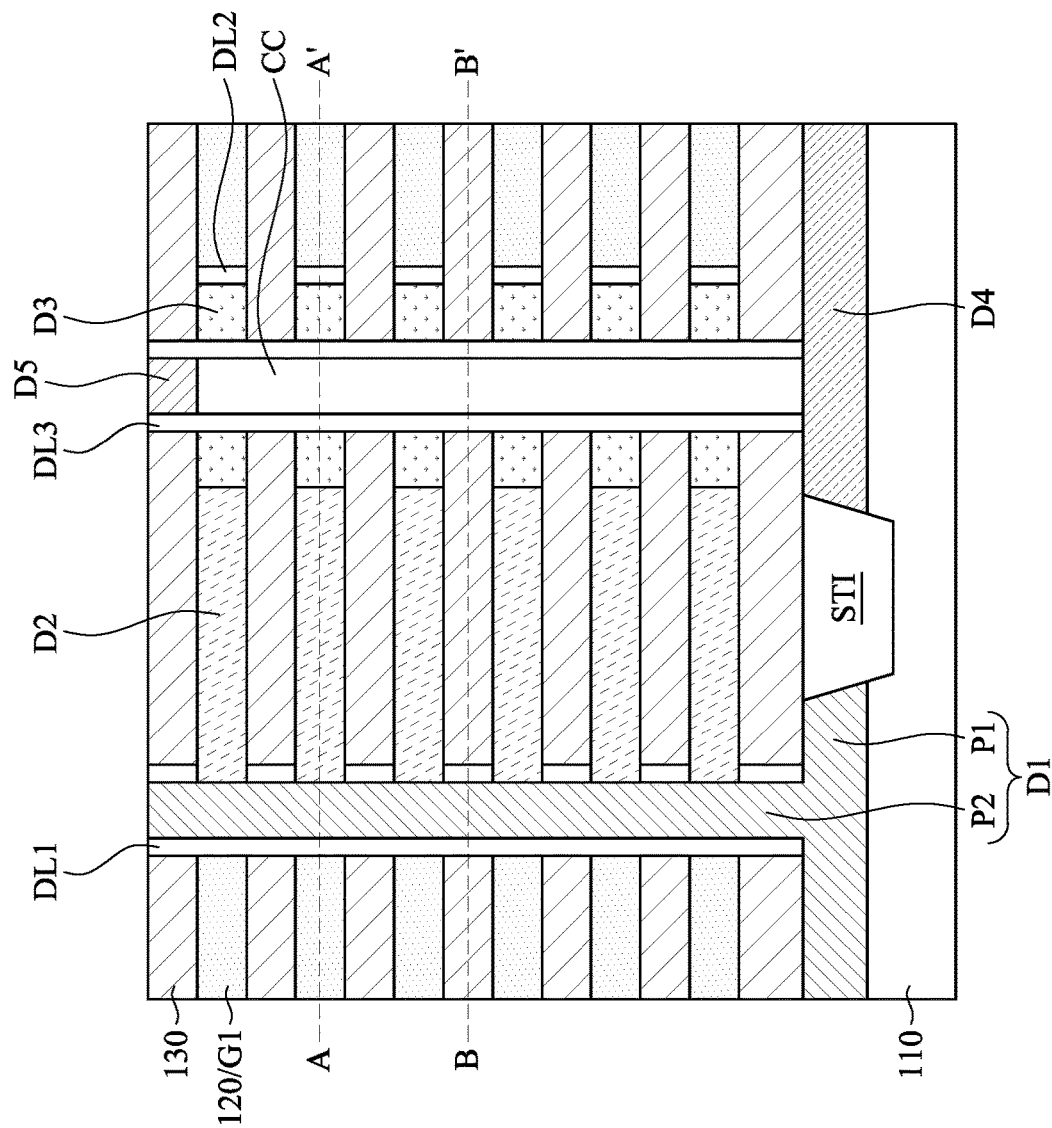

In operation 534, as shown in FIG. 6G, the first dielectric layer DL1, the first gate layers G1, and the second dielectric layers DL2 that are between the first doping layer D1 and the third doping layers D3 are removed to form a plurality of trenches T. Specifically, the portions of the first dielectric layer DL1, the portions of the first gate layers G1, and the portions of the second dielectric layers DL2 are removed to form the trenches T. In operation 536, as shown in FIG. 6H, a plurality of second doping layers D2 is formed in the trenches T to directly contact the first doping layer D1 and to connect to the third doping layers D3, in which the second doping layers D2 have the second conductive type. Please refer to FIG. 2 for the cross-section along the section line A-A'. In some embodiments, the second doping layers D2 are formed by a deposition process. In some embodiments, as shown in FIG. 6F to FIG. 6H, operation 528, operation 530, operation 532, operation 534, and operation 536 are performed in sequence. After the column channel CC is formed in the second hole H2, the second doping layers D2 are formed to connect to the first doping layer D1 and the third doping layers D3. In other embodiments, after the second doping layers D2 are formed to connect to the first doping layer D1 and the third doping layers D3, the column channel CC is formed in the second hole H2. In operation 538, as shown in FIG. 2, a plurality of fourth dielectric layers DL4 is formed adjacent to the second doping layers D2. In operation 540, as shown in FIG. 2, a plurality of second gate layers G2 is formed adjacent to the fourth dielectric layers DL4. In operation 542, as shown in FIG. 6H, the top portion of column channel CC is doped to form the fifth doping layer D5.

Figure 6I:
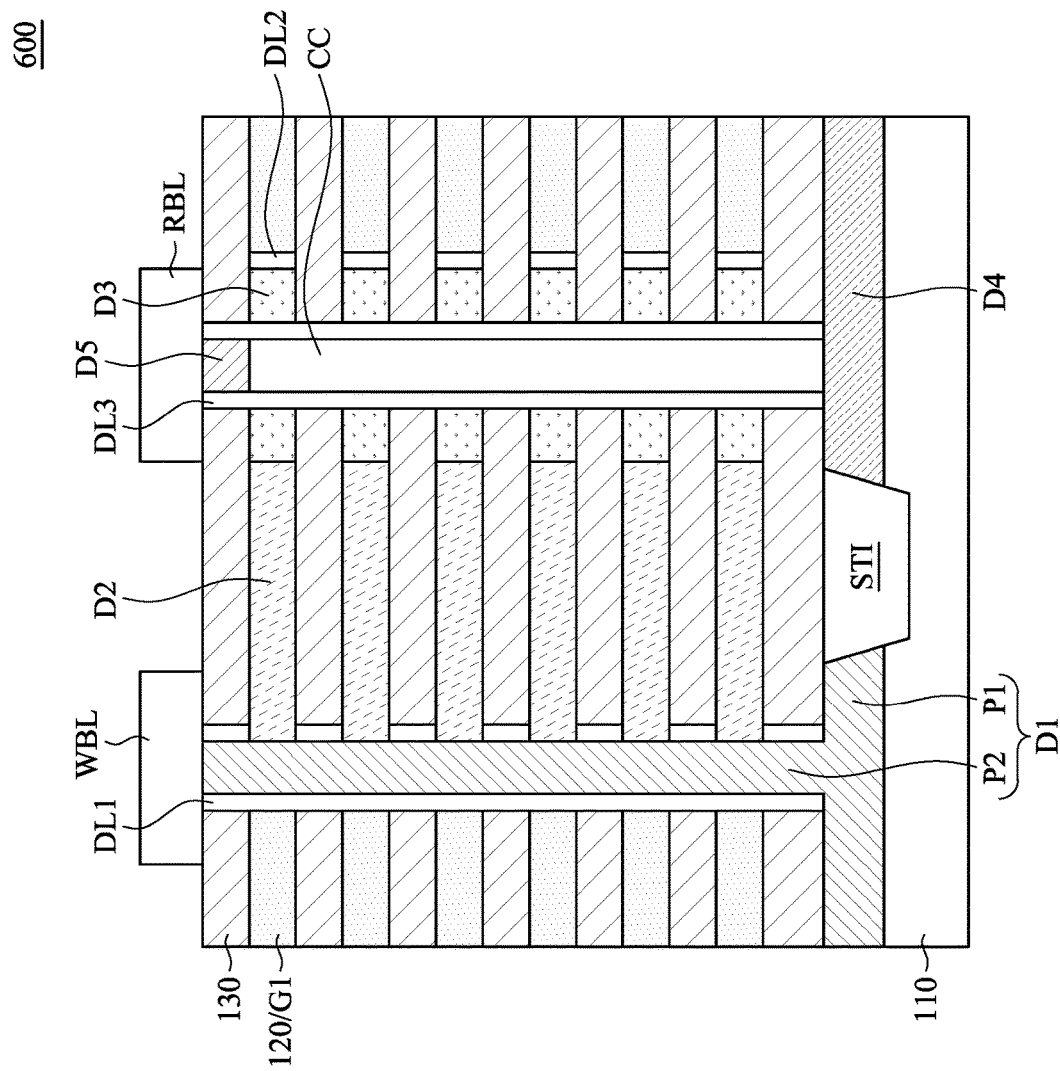

In operation 544, as shown in FIG. 6I, the write bit-line WBL is formed on the first doping layer D1, and the read bit-line RBL is formed on the fifth doping layer D5. The difference between the memory structure 600 in FIG. 6I and the memory structure 100 in FIG. 1B is that the memory structure 600 further includes the write bit-lines WBL disposed on the first doping layer D1 and the read bit-line RBL disposed on the fifth doping layer D5, in which the write bit-line WBL is coupled to the first doping layer D1, the read bit-line RBL is coupled to the fifth doping layer D5.

Figure 7:
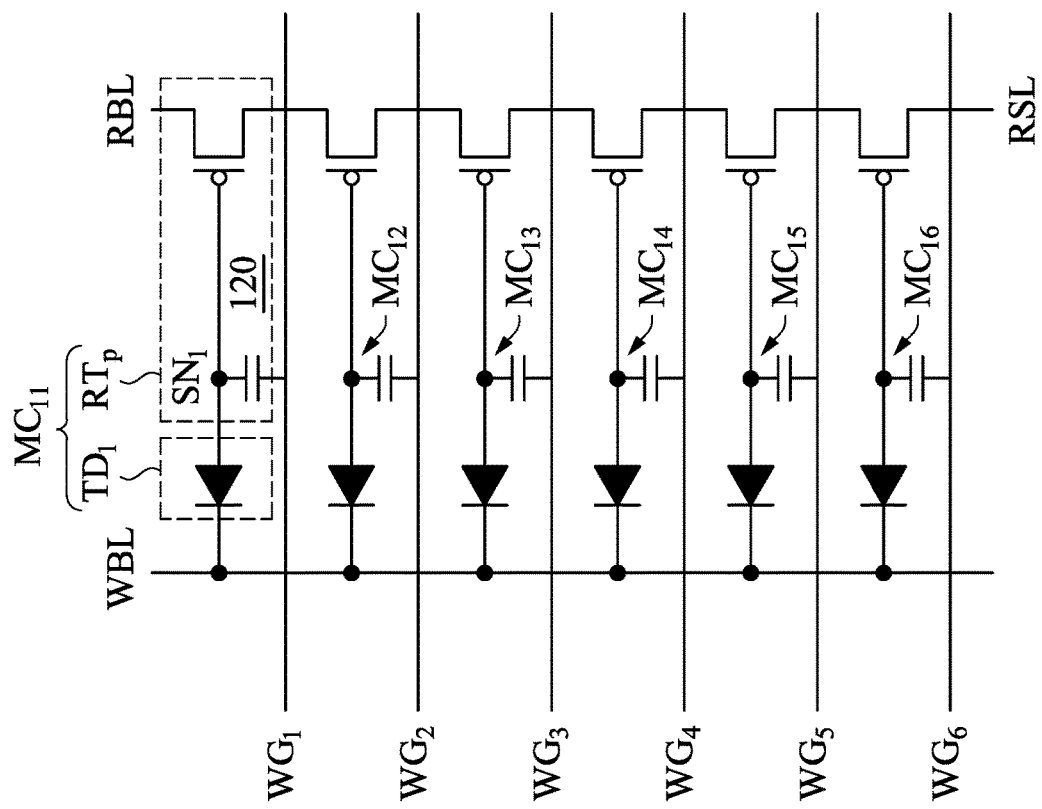
FIG. 7 and FIG. 8 are respectively equivalent circuit schematic diagrams of memory structures according to various embodiments of the present disclosure.

Please refer to FIG. 6I and FIG. 7 at the same time. FIG. 7 is an equivalent circuit schematic diagram of the memory structure 600 according to various embodiments of the present disclosure. The circuit 700 includes memory cells $MC_{11}$, $MC_{12}$, $MC_{13}$, $MC_{14}$, $MC_{15}$, $MC_{16}$, the write bit-line WBL, the read bit-line RBL, a read source-lines RSL, and a plurality of write word-lines $WG_1$, $WG_2$, $WG_3$, $WG_4$, $WG_5$, and $WG_6$. The circuit 700 may also be referred to as a string circuit. In some embodiments, in the memory structure 600, the first conductive type is N-type, the second conductive type is P-type, the first doping layer D1 is an N+ doping region, the second doping layers D2 are P− doping regions, the first doping layer D1 and the second doping layers D2 form a plurality of tunnel diodes $TD_1$ as shown in FIG. 7, in which the first doping layer D1 is a cathode, and the second doping layers D2 are anodes. Furthermore, the third doping layers D3 are P+ doping regions, and the fourth doping layer D4 and the fifth doping layer D5 are P+ doping regions. The gate layers 120, the third doping layers D3, the fourth doping layer D4, the fifth doping layer D5, and the columnar channel CC form a plurality of read transistor $RT_p$ as shown in FIG. 7, that is, a plurality of P-type transistors. The third doping layers D3 in FIG. 6I respectively correspond to the storage nodes $SN_1$ in FIG. 7. The cathodes of the tunnel diodes $TD_1$ are jointly connected to the write bit-line WBL, and the anodes of the tunnel diodes $TD_1$ are respectively connected to the storage node $SN_1$.

Please continue to refer to FIG. 6I and FIG. 7. The present disclosure provides an operating method of the memory cell $MC_{11}$. The memory cell $MC_{11}$ includes the tunnel diode $TD_1$ and the read transistor $RT_p$. The tunnel diode $TD_1$ is coupled to the write bit-line WBL, one of the gate layers 120 is coupled to the write word-line $WG_1$, one of the third doping layers D3 serves as the storage node $SN_1$ of the read transistor $RT_p$, and the read transistor $RT_p$ is coupled to the read source-line RSL and the read bit-line RBL. The storage node $SN_1$ and the adjacent gate layer 120 form a capacitor.

When data 0 is to be written, a reverse bias is applied to the tunnel diode $TD_1$. More specifically, the voltage applied to the write bit-line WBL is higher than the voltage applied to the write word-line $WG_1$. As a result, electron tunneling occurs in the tunnel diode $TD_1$, causing the storage node $SN_1$ to have high potential. The storage node $SN_1$ determines the threshold voltage of the read transistor $RT_p$. Therefore, during a read operation, no current flows through the read transistor $RT_p$. When data 1 is to be written, a forward bias is applied to the tunnel diode $TD_1$. More specifically, the voltage applied to the write bit-line WBL is lower than the voltage applied to the write word-line $WG_1$. Thus, the storage node $SN_1$ has low potential, and storage node $SN_1$ determines the threshold voltage of the read transistor $RT_p$. Therefore, during a read operation, a current flowing through the read transistor $RT_p$ can measured. In addition, please refer to the memory cell $MC_{11}$ to understand the structures and operation modes of the memory cells $MC_{12}$, $MC_{13}$, $MC_{14}$, $MC_{15}$, and $MC_{16}$, which will not be described again. The memory cells $MC_{11}$, $MC_{12}$, $MC_{13}$, $MC_{14}$, $MC_{15}$, and $MC_{16}$ can store data 1 or data 0 respectively.

Please continue to refer to FIG. 6I and FIG. 7. The present disclosure provides an operating method of the memory structure 600. A write operation is performed. The write operation includes: applying a reverse bias to a first one of the tunnel diodes $TD_1$, so that one of the third doping layers D3 (or storage nodes $SN_1$) corresponding to the first one has high potential, thereby writing data 0 to the corresponding read transistor $RT_p$. Alternatively, a write operation is performed. The write operation includes: applying a forward bias to a second one of the tunnel diodes $TD_1$, so that one of the third doping layers D3 (or storage nodes $SN_1$) corresponding to the second one has low potential, thereby writing data 1 to the corresponding read transistor $RT_p$. In some embodiments, the operating method further includes the following operations. 0V is applied to a selected gate of the gate layers 120 corresponding to the third doping layer D3 having the high potential or the low potential. A plurality of negative voltages is applied to a plurality of unselected gates of the gate layers 120 to turn on the read transistor $RT_p$ corresponding to the unselected gates. A positive voltage is applied to the fourth doping layer D4 or the fifth doping layer D5 to read data 0 or data 1 in the read transistor $RT_p$ corresponding to the selected gate.

Figure 8:
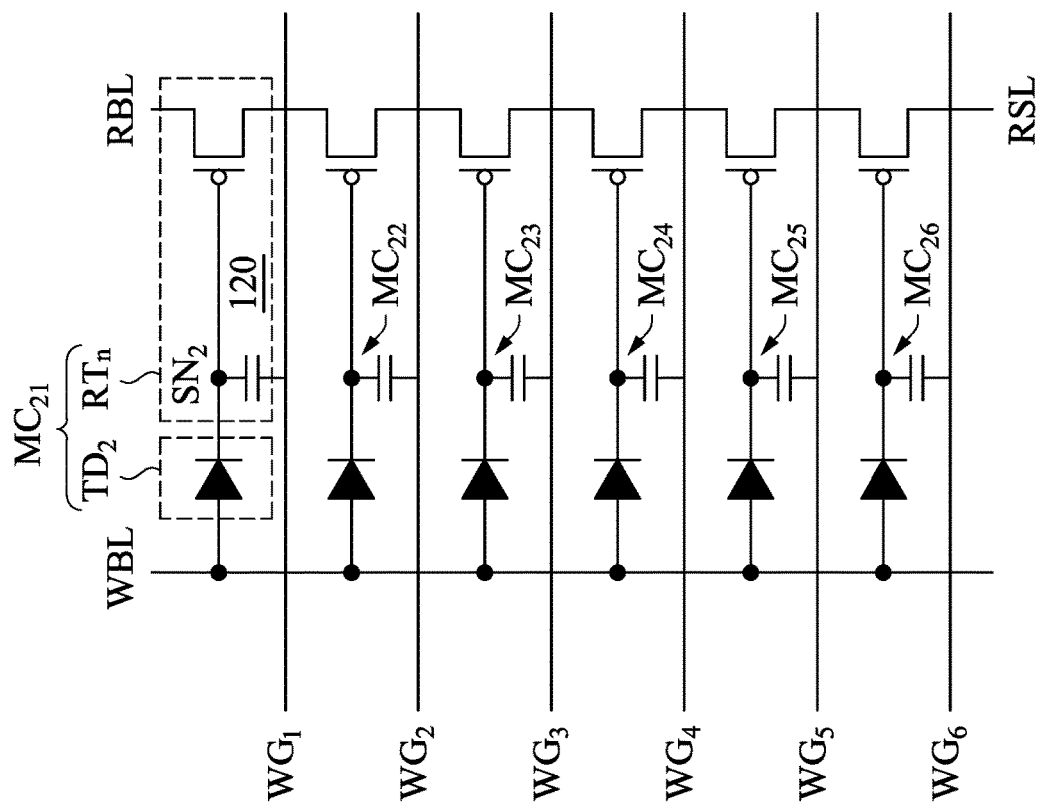

Please refer to FIG. 6I and FIG. 8 at the same time. FIG. 8 is an equivalent circuit schematic diagram of the memory structure 600 according to various embodiments of the present disclosure. The circuit 800 includes memory cells $MC_{21}$, $MC_{22}$, $MC_{23}$, $MC_{24}$, $MC_{25}$, $MC_{26}$, the write bit-line WBL, the read bit-line RBL, the read source-line RSL, and a plurality of write word-lines $WG_1$, $WG_2$, $WG_3$, $WG_4$, $WG_5$, and $WG_6$. The circuit 800 may also be referred to as a string circuit. In some embodiments, in the memory structure 600, the first conductive type is P-type, the second conductive type is N-type, the first doping layer D1 is a P+ doping region, the second doping layers D2 are N− doping regions, the first doping layer D1 and the second doping layers D2 form a plurality of tunnel diodes $TD_2$ as shown in FIG. 8, in which the first doping layer D1 is an anode, and the second doping layers D2 are cathodes. Furthermore, the third doping layers D3 are N+ doping regions, and the fourth doping layer D4 and the fifth doping layer D5 are N+ doping regions. The gate layers 120, the third doping layers D3, the fourth doping layer D4, the fifth doping layer D5, and the column channel CC form a plurality of read transistors $RT_n$ as shown in FIG. 8, that is, a plurality of N-type transistors. The third doping layers D3 in FIG. 6I respectively correspond to the storage nodes $SN_2$ in FIG. 8. The anodes of the tunnel diodes $TD_2$ are jointly connected to write bit-line WBL, and the cathodes of the tunnel diodes $TD_2$ are respectively connected to the storage node $SN_2$.

Please continue to refer to FIG. 6I and FIG. 8. The present disclosure provides an operating method of the memory cell $MC_{21}$. The memory cell $MC_{21}$ includes the tunnel diode $TD_2$ and the read transistor $RT_n$. The tunnel diode $TD_2$ is coupled to the write bit-line WBL, one of the gate layers 120 is coupled to the write word-lines $WG_1$, one of the third doping layers D3 serves as the storage node $SN_2$ of the read transistor $RT_n$, and the read transistor $RT_n$ is coupled to the read source-line RSL and the read bit-line RBL. The storage node $SN_2$ and adjacent gate layer 120 form a capacitor.

When data 1 is to be written, a forward bias is applied to the tunnel diode $TD_2$. More specifically, the voltage applied to the write bit-line WBL is higher than the voltage applied to the write word-line $WG_1$. Thus, the storage node $SN_2$ has high potential, and the storage node $SN_2$ determines the threshold voltage of the read transistor $RT_n$. Therefore, during a read operation, a current flowing through the read transistor $RT_n$ can measured. When data 0 is to be written, a reverse bias is applied to the tunnel diode $TD_2$. More specifically, the voltage applied to the write bit-line WBL is lower than the voltage applied to the write word-line $WG_1$. As a result, electron tunneling occurs in the tunnel diode $TD_2$, causing the storage node $SN_2$ to have low potential. The storage node $SN_2$ determines the threshold voltage of the read transistor $RT_n$. Therefore, during a read operation, no current flows through the read transistor $RT_n$. In addition, please refer to the memory cell $MC_{21}$ to understand the structures and operation modes of the memory cells $MC_{22}$, $MC_{23}$, $MC_{24}$, $MC_{25}$, and $MC_{26}$, which will not be described again. The memory cells $MC_{21}$, $MC_{22}$, $MC_{23}$, $MC_{24}$, $MC_{25}$, and $MC_{26}$ can store data 1 or data 0 respectively.

Please continue to refer to FIG. 6I and FIG. 8. The present disclosure provides an operating method of the memory structure 600. A write operation is performed. The write operation includes: applying a reverse bias to a first one of the tunnel diodes $TD_2$, so that one of the third doping layers D3 (or storage nodes $SN_2$) corresponding to the first one has low potential, thereby writing data 0 to the corresponding read transistor $RT_n$. Alternatively, a write operation is performed. The write operation includes: applying a forward bias to the second one of the tunnel diodes $TD_2$, so that one of the third doping layers D3 (or storage nodes $SN_2$) corresponding to the second one has high potential, thereby writing data 1 to the corresponding read transistor $RT_n$. In some embodiments, the operating method further includes the following operations. 0V is applied to a selected gate of the gate layers 120 corresponding to the third doping layer D3 having the high potential or the low potential. A plurality of positive voltages are applied to a plurality of unselected gates of the gate layers 120 to turn on the read transistor $RT_n$ corresponding to the unselected gates. A positive voltage is applied to the fourth doping layer or the fifth doping layer to read data 0 or data 1 in the read transistor $RT_n$ corresponding to the selected gate.

Please refer to FIG. 1A, FIG. 1B, and FIG. 4 again. In some embodiments, the memory array 400 further includes a plurality of read source-lines (not shown) extending along the first direction Y. The fourth doping layers D4 of the memory structures 100 arranged along the first direction Y are coupled to each other through the read source-lines. In some embodiments, the read source-lines are collectively connected to a page buffer (not shown). In some embodiments, the write bit-lines WBL are respectively connected to string select lines (SSLs) (not shown) having transistors to control whether the voltages of the write bit-lines WBL are applied to the memory structures 100. In some embodiments, in the memory array 400, the first doping layers D1 are respectively connected to global select lines (GSLs) (not shown) having transistors to control the voltages applied to the first doping layers D1.

Figure 9:
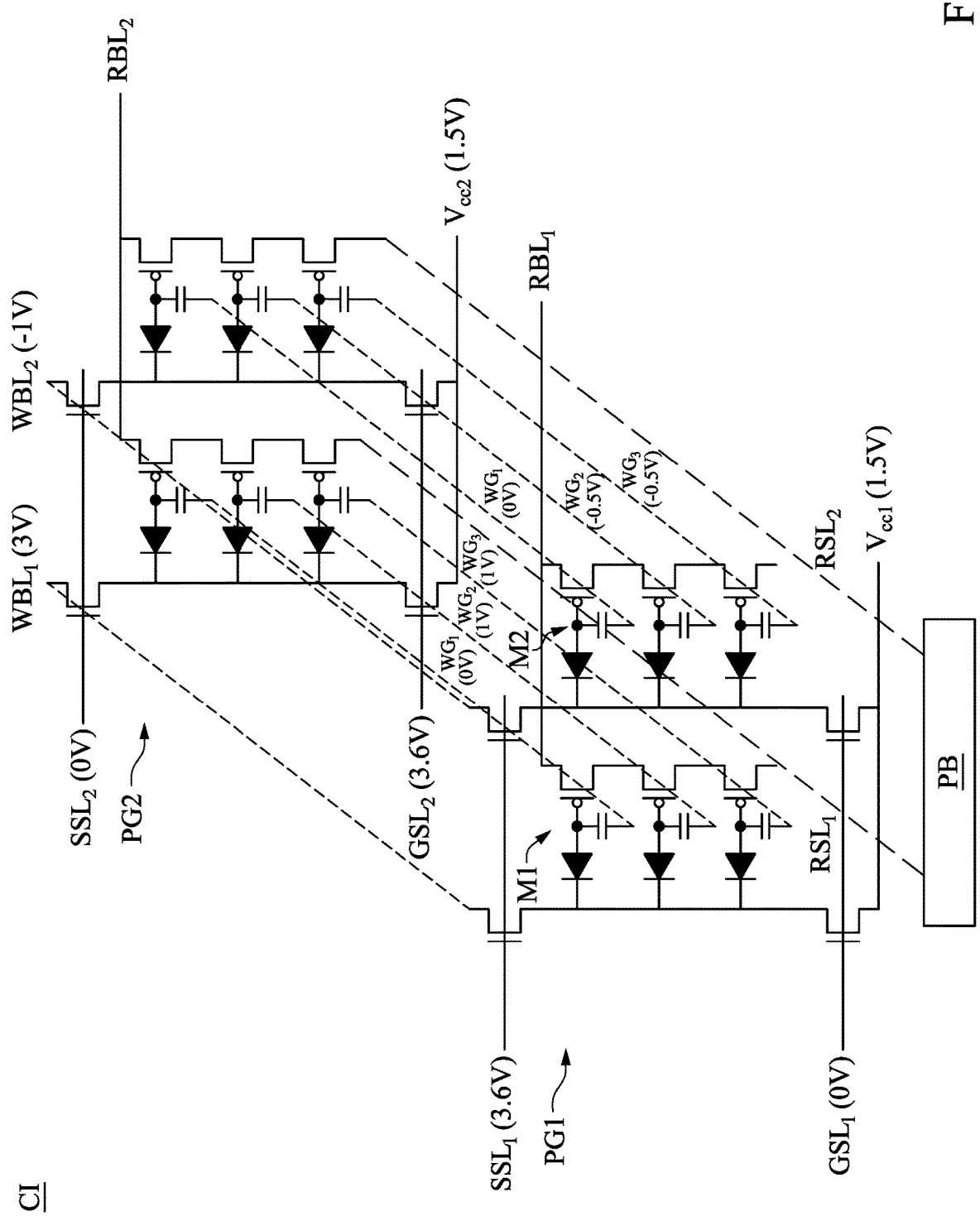
FIG. 9, FIG. 11, and FIG. 13 are respectively circuit schematic diagrams of memory arrays according to various embodiments of the present disclosure.

Next, FIG. 9 to FIG. 14 are used to further explain how to write, read, or erase the data of the memory array. FIG. 9 is a circuit schematic diagram of a memory array according to various embodiments of the present disclosure. As shown in FIG. 9, a circuit CI includes a page PG1, a page PG2, write word-lines $WG_1$, $WG_2$, $WG_3$, write bit-lines $WBL_1$, $WBL_2$, read source-lines $RSL_1$, $RSL_2$, string select lines $SSL_1$, $SSL_2$, global select lines $GSL_1$, $GSL_2$, and a page buffer PB. The page PG1 and the page PG2 respectively include 6 memory cells, and each memory cell includes a tunnel diode and a P-type read transistor. The page buffer PB may be further coupled to a sense amplifier (SA) (not shown). The write word-lines $WG_1$, $WG_2$, $WG_3$ are coupled to the P-type read transistors in the page PG1 and the page PG2 respectively. In the page PG1 and the page PG2, during the read operation, the read bit-lines $RBL_1$, $RBL_2$ may or may not be applied with voltage, thereby determining which page data to be read. In the page PG1 and the page PG2, the string select lines $SSL_1$, $SSL_2$ and the global select lines $GSL_1$, $GSL_2$ are used to control the switches of transistors respectively. These transistors serve as switches for selecting string circuits. The transistors on different strings share the same string select line and the same global select line. The string circuits in the page PG1 and the page PG2 are connected to the source or drain of the transistors of the string select line and global select lines respectively. The supply voltages $V_{CC1}$, $V_{CC2}$ are used to provide voltage to the cathodes of the tunnel diodes respectively. The read source-lines $RSL_1$, $RSL_2$ are respectively coupled to the string circuits of different pages and coupled to the page buffer PB. The page buffer PB can read the data of the entire page at the same time. The numbers of the page, the write bit-line, the read source-line, the string select line, the global select line, and the memory cells are not limited to the numbers shown in FIG. 9, and can be adjusted arbitrarily according to design requirements.

The following explains how to perform a write operation in the circuit CI of FIG. 9, in which the page PG1 is a page selected for writing, and the page PG2 is a page not selected for writing. For example, data 0 can be written in the memory cell $M_1$ of the page PG1, and data 1 can be written in the memory cell $M_2$ by using the operating voltages in Table 1 below. In more detail, the voltage of the string select line $SSL_1$ is 3.6V, so the transistors can be turned on. Therefore, the write bit-line $WBL_1$ applies 3V to the cathodes of the tunnel diodes in the memory cells, and the write bit-line $WBL_2$ applies -1V to the cathodes of the tunnel diodes in the memory cells. The voltages of the write word-lines $WG_1$ is 0V, and the voltages of the write word-lines $WG_2$ and $WG_3$ are -0.5V or 1V. Therefore, the tunnel diode of the memory cell $M_1$ is applied with a reverse bias so that the storage node has high potential, thereby writing data 0 to the memory cell $M_1$. The tunnel diode of the memory cell $M_2$ is applied with a forward biased so that the storage node has low potential, thereby writing data 1 to the memory cell $M_2$. In the page PG1, the biases applied to the tunnel diodes of the memory cells other than the memory cells $M_1$ and $M_2$ are not enough to make the storage nodes have high potential or low potential. The page PG2 is a page not selected for writing, so the voltage of the string select line $SSL_2$ is 0V. Please refer to Table 2 below. The supply voltage $V_{CC2}$ is 1.5V, the voltages of the write word-lines $WG_1$ is 0V, and the voltages of the write word-lines $WG_2$ and $WG_3$ are -0.5V or 1V. Therefore, in the page PG2, the reverse biases applied to the tunnel diodes of the memory cells are not enough to make the storage nodes have high potential.

TABLE 1

| | $WG_1$ | $WG_2$ | $WG_3$ | $WBL_1$ | $WBL_2$ | $SSL_1$ | $GSL_1$ | $V_{CC1}$ |
|---|---|---|---|---|---|---|---|---|
| Voltage (V) | 0 | -0.5/1 | -0.5/1 | 3 | -1 | 3.6 | 0 | 1.5 |

TABLE 2

| | $WG_1$ | $WG_2$ | $WG_3$ | $WBL_1$ | $WBL_2$ | $SSL_2$ | $GSL_2$ | $V_{CC2}$ |
|---|---|---|---|---|---|---|---|---|
| Voltage (V) | 0 | -0.5/1 | -0.5/1 | 3 | -1 | 0 | 3.6 | 1.5 |

Figure 10:
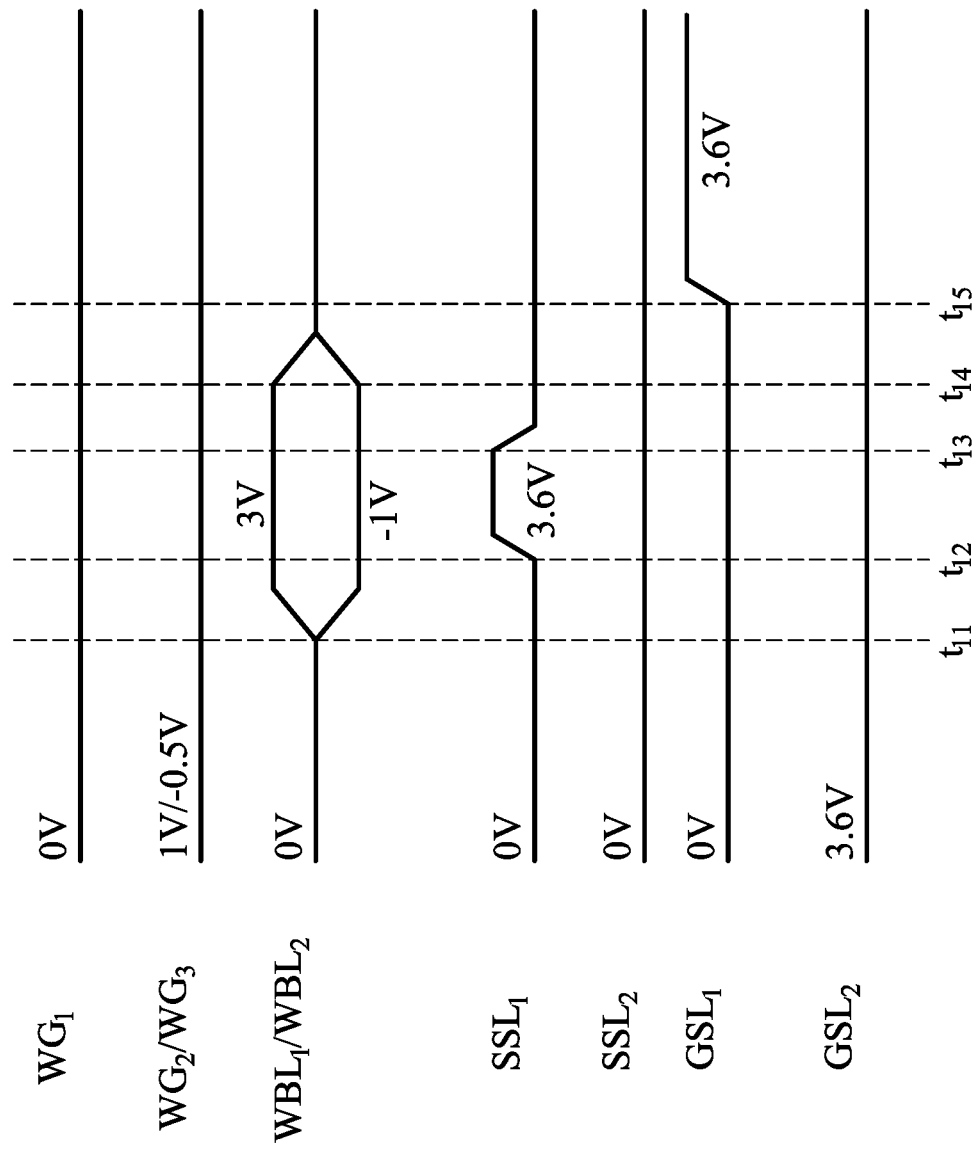
FIG. 10, FIG. 12, and FIG. 14 are respectively timing diagrams of control signals according to various embodiments of the present disclosure.

Please refer to FIG. 9 and FIG. 10 at the same time. FIG. 10 is a timing diagram of control signals according to various embodiments of the present disclosure. The voltages of the write word-lines $WG_1$ are maintained at 0V. The voltages of unselected write word-lines $WG_2$ and $WG_3$ are maintained at 1V or -0.5V. The voltage of the unselected string select line $SSL_2$ is maintained at 0V. The voltage of the unselected global select line $GSL_2$ is maintained at 3.6V. At time $t_{11}$, the voltage of the write bit-line $WBL_1$ becomes 3V, and the voltage of write bit-line $WBL_2$ becomes -1V. At time $t_{12}$, the voltage of the string select line $SSL_1$ becomes 3.6V. Therefore, the voltage of the write bit-line $WBL_1$, 3V, is applied to the cathode of the tunnel diode of the memory cell $M_1$, thereby writing data 0 to the memory cell $M_1$. The voltage of the write bit-line $WBL_2$, -1V, is applied to the cathode of the tunnel diode of the memory cell $M_2$, thereby writing data 1 to the memory cell $M_2$. At time $t_{13}$, the voltage of the string select line $SSL_1$ becomes 0V. At time $t_{14}$, the voltage of the write bit-line $WBL_1$ becomes 0V. At time $t_{15}$, the voltage of the global select line $GSL_1$ becomes 3.6V.

Figure 11:
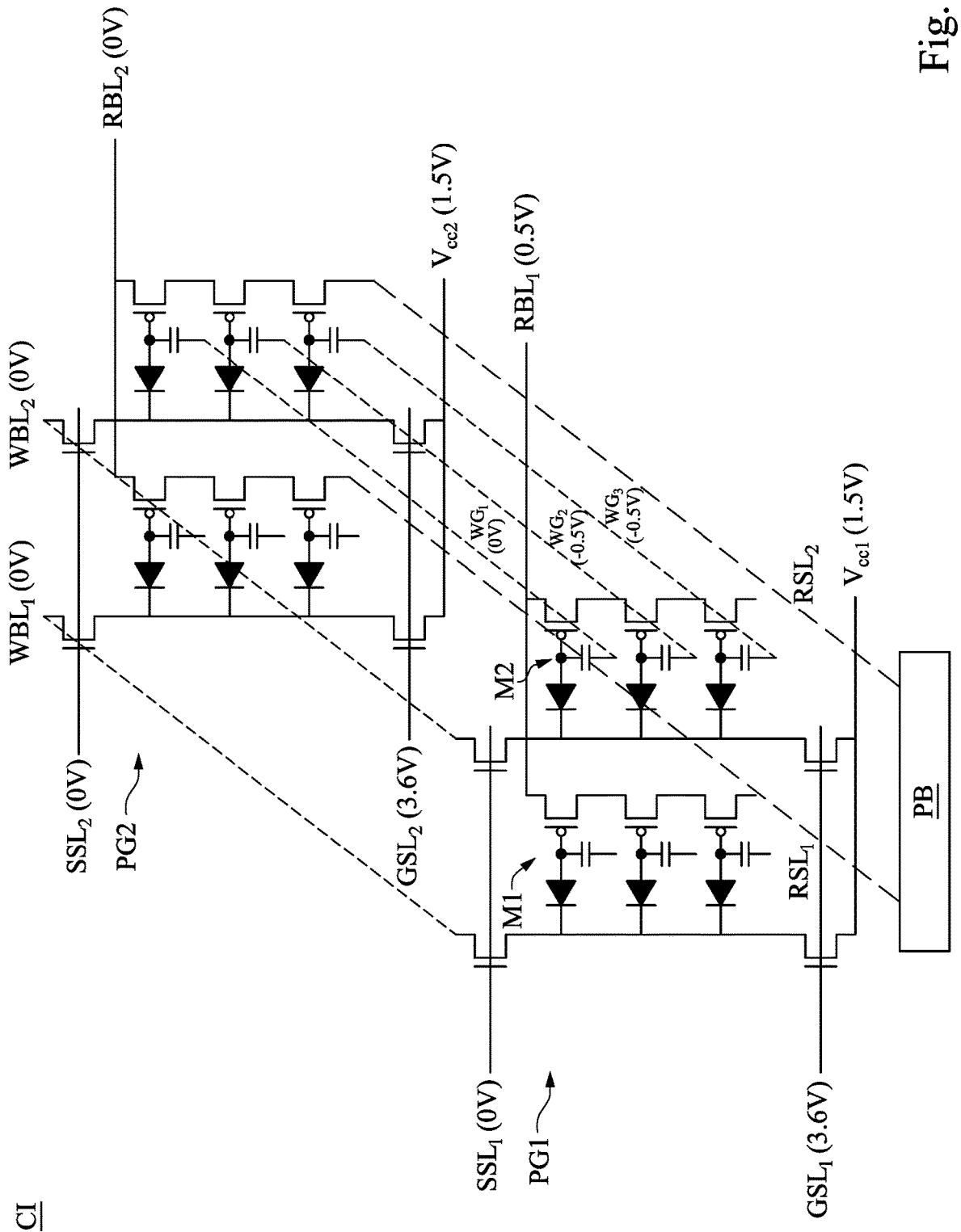

FIG. 11 is a circuit schematic diagram of a memory array according to various embodiments of the present disclosure. The following explains how to perform a read operation in the circuit CI in FIG. 11. The page PG1 is a page selected for reading, and the page PG2 is a page not selected for reading. For example, if the memory cell $M_1$ of the page PG1 stores data 0, and the memory cell $M_2$ stores data 1, the data of the memory cells $M_1$ and $M_2$ can be read through the operating voltages in Table 3 below. In more detail, the supply voltage $V_{CC1}$ is 1.5V, and 0V is applied to the write word-lines $WG_1$. The threshold voltages of the P-type read transistors in the memory cells $M_1$ and $M_2$ are determined by the storage nodes, and −0.5V is applied to the write word-lines $WG_2$ and $WG_3$ to turn on the corresponding P-type read transistors. For simplicity, some write word lines coupled to the P-type read transistors on different pages are not shown in FIG. 11. Moreover, the voltage of the read bit-line $RBL_1$ is 0.5V, and the read source-lines $RSL_1$, $RSL_2$ are respectively coupled to the string circuits of the pages PG1, PG2 to read the current. The current cannot be measured in the string circuit containing the memory cell $M_1$, which shows that the memory cell $M_1$ stores data 0. The current can be measured in the string circuit containing the memory cell $M_2$, which shows that the memory cell $M_2$ stores data 1. The page PG2 is the page not selected for reading, so the voltage of the read bit-line $RBL_2$ is 0V. In addition, reverse biases are applied to the tunnel diodes of the memory cells in the page PG2 to avoid current leakage from the storage nodes. Please refer to Table 4 below. The supply voltage $V_{CC2}$ is 1.5V, the voltages of the write word-lines $WG_1$ are 0V, and the voltages of the write word-line $WG_2$ and $WG_3$ are −0.5V. It can be seen that the tunnel diodes of the memory cells in the page PG2 are all applied with reverse biases.

TABLE 3

| | $WG_1$ | $WG_2$ | $WG_3$ | $WBL_1$ | $WBL_2$ | $RBL_1$ | $SSL_1$ | $GSL_1$ | $V_{CC1}$ |
|---|---|---|---|---|---|---|---|---|---|
| Voltage (V) | 0 | −0.5 | −0.5 | 0 | 0 | 0.5 | 0 | 3.6 | 1.5 |

TABLE 4

| | $WG_1$ | $WG_2$ | $WG_3$ | $WBL_1$ | $WBL_2$ | $RBL_2$ | $SSL_2$ | $GSL_2$ | $V_{CC2}$ |
|---|---|---|---|---|---|---|---|---|---|
| Voltage (V) | 0 | −0.5 | −0.5 | 0 | 0 | 0 | 0 | 3.6 | 1.5 |

Figure 12:
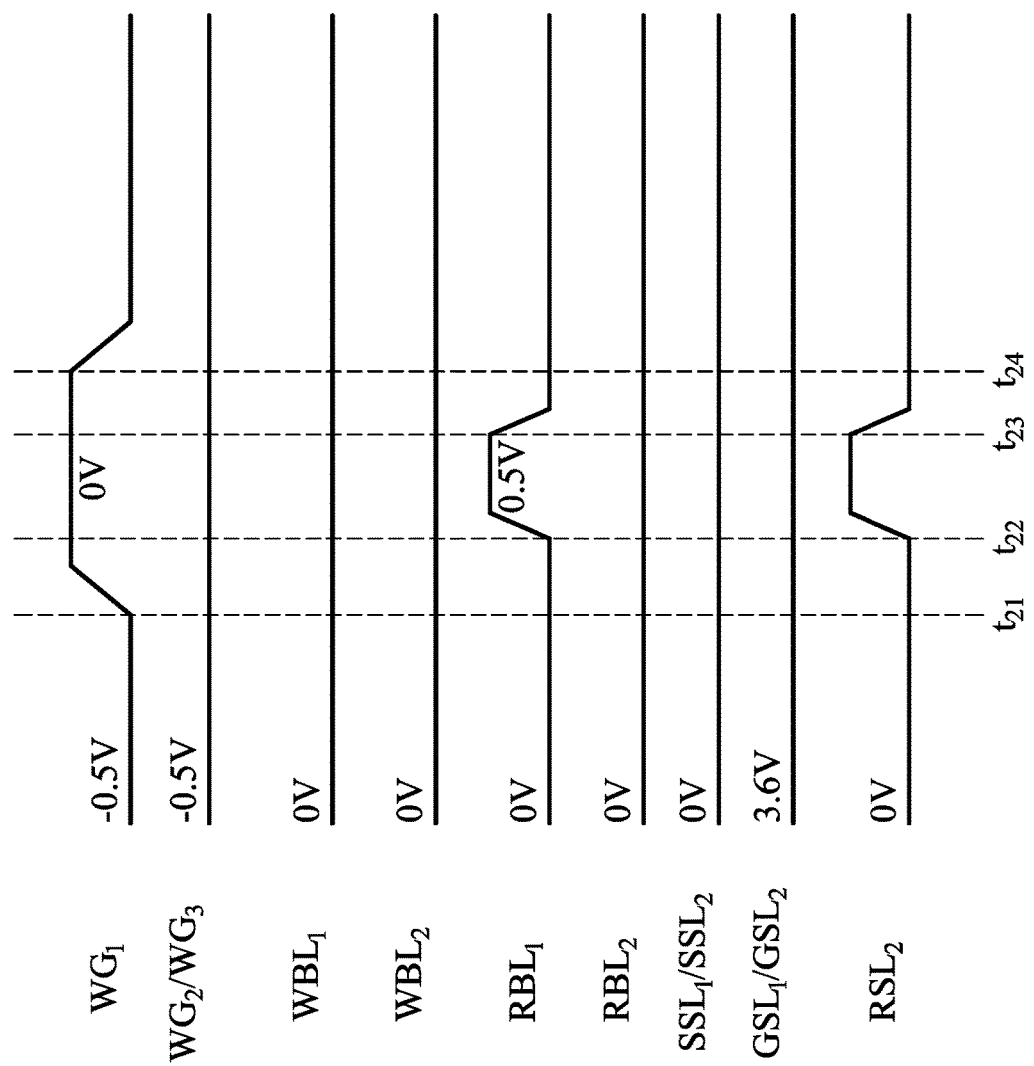

Please refer to FIG. 11 and FIG. 12 at the same time. FIG. 12 is a timing diagram of control signals according to various embodiments of the present disclosure. The voltages of the unselected write word-lines $WG_2$ and $WG_3$ are maintained at −0.5V. At time $t_{21}$, the voltages of the write word-lines $WG_1$ become 0V. At time $t_{22}$, the voltage of the read bit-line $RBL_1$ becomes 0.5V. At time $t_{23}$, the voltage of the read bit-line $RBL_1$ becomes 0V. At time $t_{24}$, the voltages of the write word-lines $WG_1$ become −0.5V. Thus, from the time $t_{22}$ to the time $t_{23}$, the read source-line $RSL_2$ can measure the current, which indicates that memory cell $M_2$ stores data 1. On the other hand, the read source-line $RSL_1$ does not measure current, which indicates that memory cell $M_1$ stores data 0.

Figure 13:
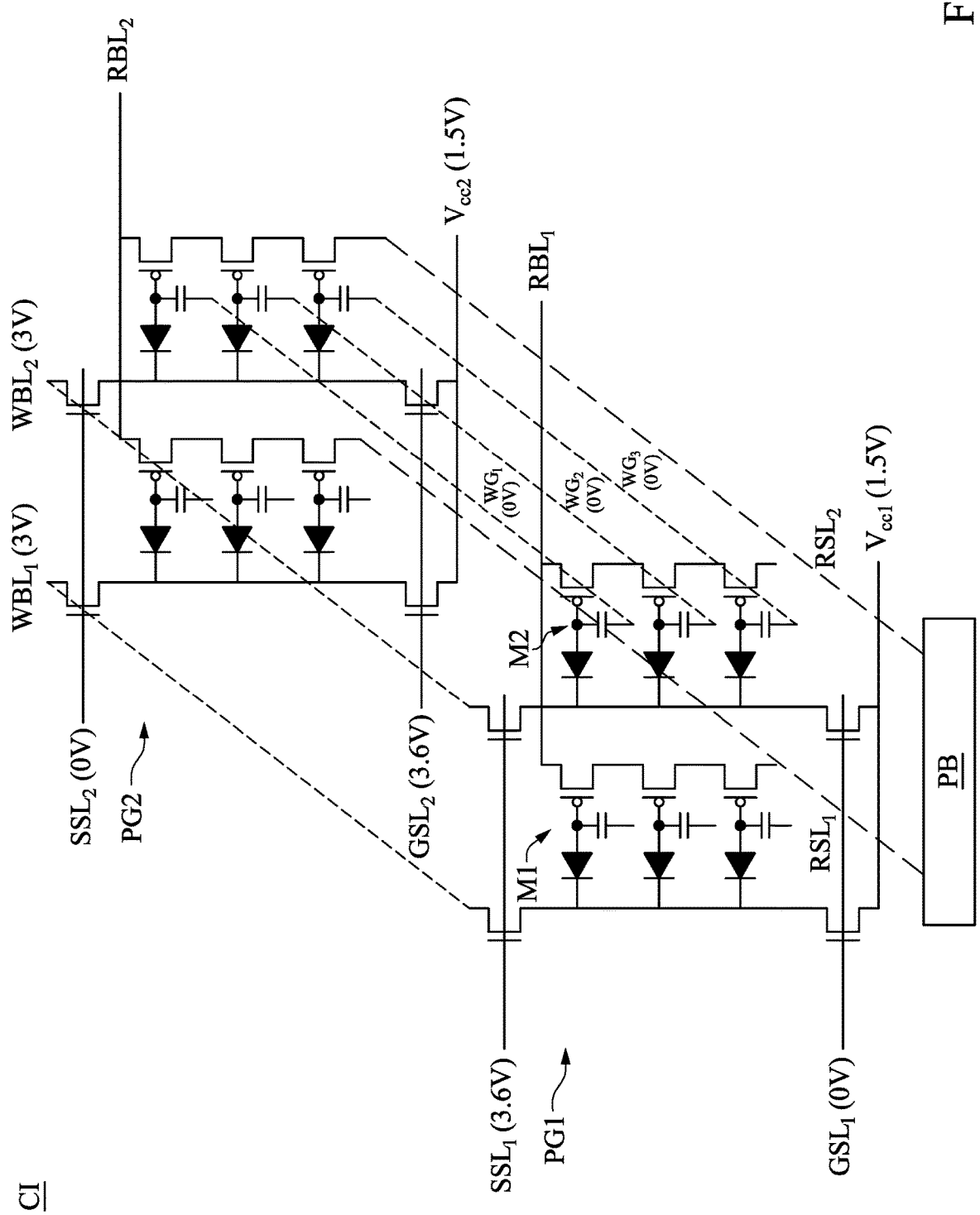

FIG. 13 is a circuit schematic diagram of a memory array according to various embodiments of the present disclosure. The following explains how to perform an erase operation in the circuit CI in FIG. 13, in which the page PG1 is a page selected for erasure, and the page PG2 is a page not selected for erasure. For example, the data in the memory cells of the page PG1 can be erased by using the operating voltages in Table 5 below. The voltage of the string select line $SSL_1$ is 3.6V, so the transistors can be turned on. The write bit-lines $WBL_1$, $WBL_2$ apply 3V to the cathodes of the tunnel diodes in the memory cells. The voltages of the write word-lines $WG_1$, $WG_2$, $WG_3$ are all 0V. Therefore, the tunnel diodes of the memory cells are all applied with reverse biases, so that the storage nodes have high potential, thereby writing data 0 to the memory cells of the page PG1. On the other hand, please refer to Table 6 below. In the page PG2, the voltage of the string select line $SSL_2$ is 0V, so the memory cells of the page PG2 will not be affected by the voltages of the write bit-lines $WBL_1$, $WBL_2$. The supply voltage $V_{CC2}$ is 1.5V, and the voltages of write word-lines $WG_1$, $WG_2$, $WG_3$ are all 0V. Therefore, in the page PG2, the reverse biases applied to the tunnel diodes of the memory cells are not enough to make the storage nodes have high potential.

TABLE 5

| | $WG_1$ | $WG_2$ | $WG_3$ | $WBL_1$ | $WBL_2$ | $SSL_1$ | $GSL_1$ | $V_{CC1}$ |
|---|---|---|---|---|---|---|---|---|
| Voltage (V) | 0 | 0 | 0 | 3 | 3 | 3.6 | 0 | 1.5 |

TABLE 6

| | $WG_1$ | $WG_2$ | $WG_3$ | $WBL_1$ | $WBL_2$ | $SSL_2$ | $GSL_2$ | $V_{CC2}$ |
|---|---|---|---|---|---|---|---|---|
| Voltage (V) | 0 | 0 | 0 | 3 | 3 | 0 | 3.6 | 1.5 |

Figure 14:
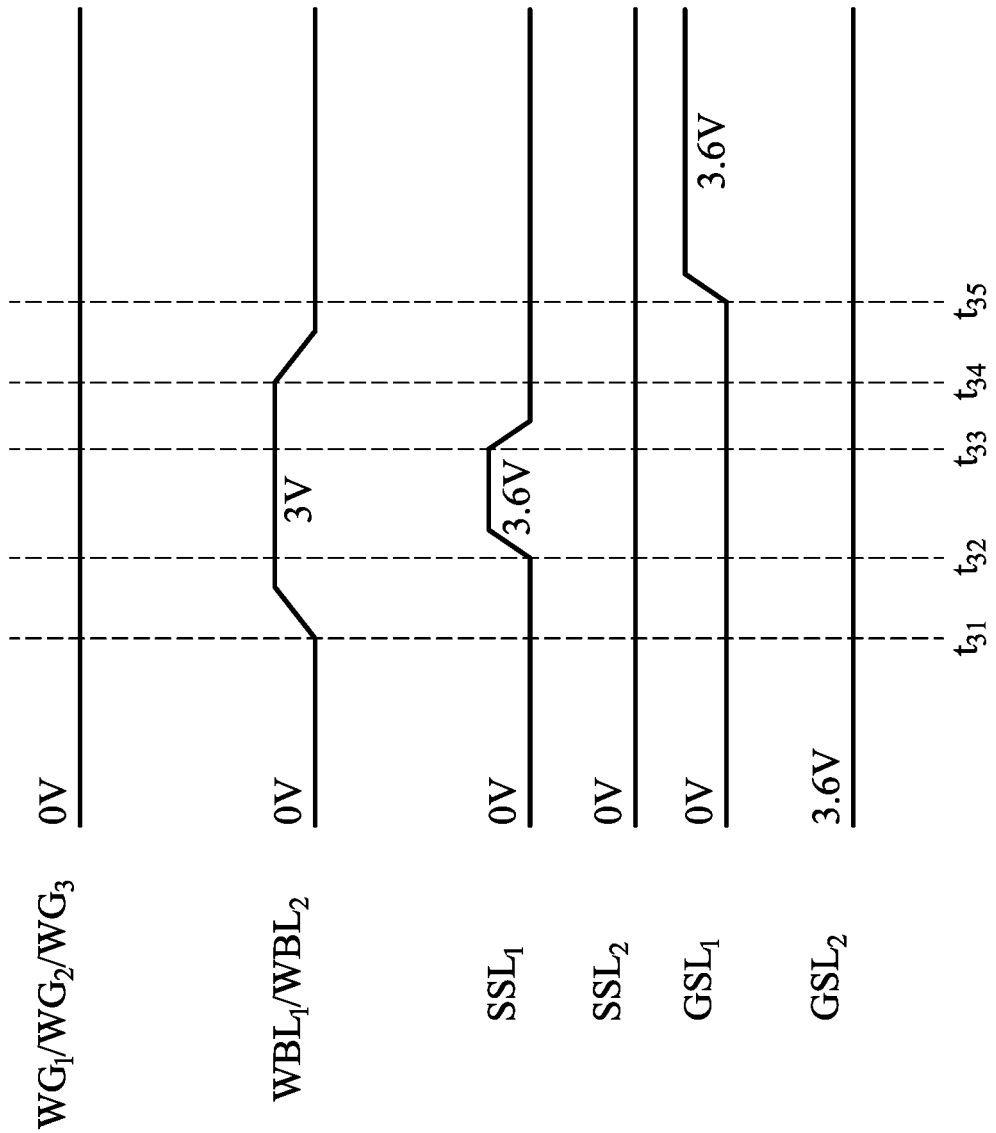

Please refer to FIG. 13 and FIG. 14 at the same time. FIG. 14 is a timing diagram of control signals according to various embodiments of the present disclosure. The voltages of the write word-lines $WG_1$, $WG_2$, $WG_3$ are maintained at 0V. The voltage of the global select line $GSL_2$ is maintained at 3.6V. At time $t_{31}$, the voltages of the write bit-lines $WBL_1$, $WBL_2$ become 3V. At time $t_{32}$, the voltage of the string select line $SSL_1$ becomes 3.6V. Therefore, the voltages of 3V of the write bit-lines $WBL_1$, $WBL_2$ are applied to the cathodes of the tunnel diodes of the memory cells of the page PG1 to apply reverse biases to the tunnel diodes, thereby causing the storage nodes have high potential. In other words, data 0 are written to the memory cells. At time $t_{33}$, the voltage of the string select line $SSL_1$ becomes 0V. At time $t_{34}$, the voltages of the write bit-lines $WBL_1$, $WBL_2$ become 0V. At time $t_{35}$, the voltage of the global select line $GSL_1$ becomes 3.6V.

In summary, the present disclosure provides a memory structure, a manufacturing method thereof, an operation method thereof, and a memory array. In the memory structure and the memory array, each memory cell includes a tunnel diode and a read transistor to form a 1D1T DRAM structure. The read transistors are vertically interconnected, so the density of the memory cells can be increased, which is beneficial to the size reduction of the memory structure and memory array. Moreover, the manufacturing method of the present disclosure has a simple process, so the manufacturing cost can be reduced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the present disclosure. In view of the foregoing, it is intended that the present disclosure cover modifications and variations of this disclosure provided they fall within the scope of the following claims.

What is claimed is:

1. A memory structure, comprising:
    a plurality of insulating layers and a plurality of gate layers that are alternately stacked;
    a first doping layer penetrating through the insulating layers and the gate layers and having a first conductive type;
    a plurality of second doping layers respectively in direct contact with the first doping layer and having a second conductive type different from the first conductive type, wherein the first doping layer and the second doping layers form a plurality of tunnel diodes, and the second doping layers and the insulating layers are alternately stacked;
    a columnar channel penetrating through the insulating layers and the gate layers;
    a plurality of third doping layers respectively surrounding the columnar channel, wherein the third doping layers are respectively connected to the second doping layers, and the third doping layers have the second conductive type;
    a fourth doping layer and a fifth doping layer coupled to the columnar channel;
    a first dielectric layer disposed between the first doping layer and the gate layers;
    a plurality of second dielectric layers respectively disposed between the third doping layers and the gate layers;
    a third dielectric layer disposed between the columnar channel and the third doping layers; and
    a plurality of fourth dielectric layers respectively disposed between the second doping layers and the gate layers.

2. The memory structure of claim 1, wherein the first conductive type is N-type, and the second conductive type is P-type.

3. The memory structure of claim 1, wherein the first conductive type is P-type, and the second conductive type is N-type.

4. The memory structure of claim 1, further comprising a write bit-line disposed on the first doping layer.

5. The memory structure of claim 1, further comprising a read bit-line coupled to the fifth doping layer.

6. The memory structure of claim 1, wherein the fourth doping layer is disposed under the columnar channel, the fifth doping layer is disposed on the columnar channel, and the fourth doping layer and the fifth doping layer have the second conductive type.

7. The memory structure of claim 6, further comprising a read bit-line disposed on the fifth doping layer.

8. The memory structure of claim 6, wherein the columnar channel has the first conductive type.

9. The memory structure of claim 1, wherein the columnar channel is undoped.

10. The memory structure of claim 1, wherein doping concentrations of the third doping layers are higher than doping concentrations of the second doping layers.

11. A memory array, comprising:
    a plurality of memory structures of claim 1;
    a plurality of write bit-lines extending along a first direction, wherein the first doping layers of the memory structures arranged along the first direction are coupled to each other through the write bit-lines; and
    a plurality of read bit-lines extending along a second direction, wherein the first direction is perpendicular to the second direction, and the fifth doping layers of the memory structures arranged along the second direction are coupled to each other through the read bit-lines.

12. A manufacturing method of a memory structure, comprising:
    forming a first hole penetrating through a plurality of insulating layers and a plurality of first gate layers that are alternately stacked;
    forming a first dielectric layer to cover a sidewall of the first hole;
    forming a first doping layer in the first hole, wherein the first doping layer has a first conductive type;
    forming a second hole penetrating through the insulating layers and the first gate layers;
    partially removing the first gate layers exposed from the second hole to form a plurality of recess portions;
    forming a plurality of second dielectric layers in the recess portions;
    forming a plurality of second doping layers to cover the second dielectric layers, wherein the second doping layers have a second conductive type that is different from the first conductive type;
    forming a third dielectric layer in the second hole to cover the insulating layers and the second doping layers;
    forming a columnar channel in the second hole;
    removing the first dielectric layer, the first gate layers, and the second dielectric layers between the first doping layer and the second doping layers to form a plurality of trenches; and
    forming a plurality of third doping layers in the trenches to directly contact the first doping layer and connect to the second doping layers, wherein the third doping layers have the second conductive type.

13. The manufacturing method of claim 12, further comprising:
    after forming the third doping layers in the trenches, forming a plurality of fourth dielectric layers adjacent to the third doping layers; and
    forming a plurality of second gate layers adjacent to the fourth dielectric layers.

14. The manufacturing method of claim 12, further comprising:
    before forming the second hole penetrating through the insulating layers and the first gate layers, forming a fourth doping layer in a substrate, and forming the insulating layers and the first gate layers on the substrate, wherein the second hole exposes the fourth doping layer; and
    doping a top portion of the columnar channel to form a fifth doping layer.

15. The manufacturing method of claim 14, further comprising:

forming a write bit-line on the first doping layer; and
forming a read bit-line on the fifth doping layer.

16. The manufacturing method of claim 12, wherein the first conductive type is N-type, and the second conductive type is P-type.

17. The manufacturing method of claim 12, wherein the first conductive type is P-type, and the second conductive type is N-type.

18. An operating method of a memory structure, comprising:
receiving the memory structure of claim 1, wherein the gate layers, the third doping layers, the fourth doping layer, the fifth doping layer, and the columnar channel form a plurality of read transistors; and
performing a write operation, wherein the write operation comprises:
when the read transistors are P-type transistors, and the first conductive type is N-type,
applying a reverse bias to a first one of the tunnel diodes so that one of the third doping layers corresponding to the first one has high potential; or
applying a forward bias to a second one of the tunnel diodes so that one of the third doping layers corresponding to the second one has low potential;
when the read transistors are N-type transistors, and the first conductive type is P-type,
applying a reverse bias to a third one of the tunnel diodes so that one of the third doping layers corresponding to the third one has low potential; or
applying a forward bias to a fourth one of the tunnel diodes so that one of the third doping layers corresponding to the fourth one has high potential.

19. The operating method of claim 18, wherein the read transistors are the P-type transistors, and the operating method further comprises:
applying 0V to a selected gate of the gate layers corresponding to the third doping layer having the high potential or the low potential;
applying a plurality of negative voltages to a plurality of unselected gates in the gate layers; and
applying a positive voltage to the fourth doping layer or the fifth doping layer.

20. The operating method of claim 18, wherein the read transistors are the N-type transistors, and the operating method further comprises:
applying 0V to a selected gate of the gate layers corresponding to the third doping layer having the high potential or the low potential;
applying a plurality of positive voltages to a plurality of unselected gates in the gate layers; and
applying a positive voltage to the fourth doping layer or the fifth doping layer.

* * * * *